United States Patent
Takase et al.

(10) Patent No.: US 7,095,657 B2
(45) Date of Patent: Aug. 22, 2006

(54) NONVOLATILE SEMICONDUCTOR MEMORY DEVICE CAPABLE OF REALIZING OPTIMIZED ERASING OPERATION IN A MEMORY ARRAY

(75) Inventors: Yoshinori Takase, Tokyo (JP); Hideaki Kurata, Kodaira (JP); Keiichi Yoshida, Musashimurayama (JP); Ken Matsubara, Higashimurayama (JP); Michitaro Kanamitsu, Ome (JP); Shinji Yuasa, Tachikawa (JP)

(73) Assignees: Renesas Technology Corp., Tokyo (JP); Hitachi ULSI Systems Co., Inc., Tokyo (JP)

( * ) Notice: Subject to any disclaimer, the term of this patent is extended or adjusted under 35 U.S.C. 154(b) by 0 days.

(21) Appl. No.: 11/224,964

(22) Filed: Sep. 14, 2005

(65) Prior Publication Data

US 2006/0007737 A1  Jan. 12, 2006

Related U.S. Application Data

(63) Continuation of application No. 10/499,667, filed as application No. PCT/JP02/01844 on Feb. 28, 2002, now Pat. No. 6,958,940.

(51) Int. Cl.
*G11C 7/10* (2006.01)

(52) U.S. Cl. .................. 365/189.05; 365/230.03; 365/230.08; 365/188; 365/230.06

(58) Field of Classification Search ........... 365/189.05, 365/230.03, 230.08, 230.06
See application file for complete search history.

(56) References Cited

U.S. PATENT DOCUMENTS

| | | | |
|---|---|---|---|
| 5,508,957 A | 4/1996 | Momodomi et al. ... | 365/185.17 |
| 5,956,268 A | 9/1999 | Lee ........................... | 365/185 |
| 6,172,911 B1 | 1/2001 | Tanaka et al. ......... | 365/185.22 |
| 6,646,930 B1 | 11/2003 | Takeuchi et al. ....... | 365/230.03 |
| 6,751,153 B1 * | 6/2004 | Mori et al. ............ | 365/230.06 |
| 6,754,128 B1 * | 6/2004 | Wong ........................ | 365/222 |
| 6,850,438 B1 | 2/2005 | Lee et al. .............. | 365/185.11 |

FOREIGN PATENT DOCUMENTS

| | | |
|---|---|---|
| JP | 10-340592 | 12/1998 |
| JP | 11-224492 | 8/1999 |
| JP | 11-232886 | 8/1999 |
| JP | 2000-149581 | 5/2000 |

\* cited by examiner

*Primary Examiner*—Tuan T. Nguyen
(74) *Attorney, Agent, or Firm*—Miles & Stockbridge P.C.

(57) ABSTRACT

A nonvolatile semiconductor memory device capable of realizing optimized erasing operation in a memory array configuration in which a plurality of pages correspond to and are connected to each of a plurality of word lines and higher speed of the erasing operation. In a flash memory, the erasing operation is performed by an erasing method of erasing a plurality of pages arbitrarily selected in a lump. In a two-page erasing mode, page erasure, page pre-erasure verification, page rewriting process, page pre-rewriting verification, and page upper end determining process are performed in order. The method realizes, particularly, (1) suppression of the number of erase verification times to the minimum by performing erase verification only on arbitrary one even-numbered or odd-numbered page in the pages to be erased in consideration of variations in the erasing characteristic, and (2) prevention of erroneous determination of the upper end of erasure since it is unnecessary to set a memory cell to be rewritten every rewrite verification by continuously executing the rewriting process page by page.

7 Claims, 30 Drawing Sheets

NONVOLATILE SEMICONDUCTOR MEMORY DEVICE CAPABLE OF REALIZING OPTIMIZED ERASING OPERATION IN A MEMORY ARRAY

CROSS-REFERENCE TO RELATED APPLICATION

This application is a continuation of application Ser. No. 10/499,667 filed Jun. 21, 2004, now U.S. Pat. No. 6,958,940, issued Oct. 25, 2005, which is a 371 of PCT/JP02/01844 filed Feb. 28, 2002.

TECHNICAL FIELD

The present invention relates to a semiconductor memory device and, more particularly, to a technique effective when applied to erasing operation of a nonvolatile semiconductor memory device such as a multi-value flash memory having a memory array of a configuration in which a plurality of blocks are constructed every plural word lines and a plurality of pages are connected to each of the plurality of word lines.

BACKGROUND ART

The inventors herein have examined a flash memory as an example of a nonvolatile semiconductor memory device as follows.

For example, in a flash memory, a nonvolatile memory element having a control gate and a floating gate is used as a memory cell, and a memory cell can be constructed by a single transistor. For such a flash memory, the concept of a so-called "multi-value" flash memory for storing data of two or more bits per memory cell in order to increase storage capacity has been proposed. In such a multi-value flash memory, by controlling the amount of charges injected into the floating gate, the threshold voltage is changed step by step, and information of plural bits can be stored while being associated with a threshold voltage.

Further, in the flash memory, as the storage capacity increases, the chip size also increases. Consequently, it is requested to suppress increase in the chip size. For example, in the case of considering the chip size, there are many restrictions on the area of a memory array made by a plurality of memory cells disposed in a lattice state at crossing points between the word lines and the bit lines, so that attention has to be paid to the area of a Y-direct circuit in the memory array. A Y-direct circuit of a flash memory has, for example, a circuit configuration (refer to, for example, FIG. 4 which will be described later) employing the technique of a so-called single-end sense method.

The Y-direct circuit employing the single-end sense method has a configuration in which a sense latch circuit is disposed at one end of a global bit line, so that the circuit is employed for the purpose of reducing the area (reduction of the number of cells). Further, in the Y-direct circuit, for area reduction, a technique employing a so-called "one sense latch circuit+two SRAMs" configuration in place of the configuration of a data transfer circuit called a "one sense latch circuit+two data latch circuits" has been proposed. In the "one sense latch circuit+two SRAMS" configuration (refer to, for example, FIG. 6 which will be described later), two SRAMs are assigned to a plurality of sense latch circuits in each bank, data of an upper bit is stored in one of the SRAMs, and data of a lower bit is stored in the other SRAM.

A technique employing a configuration of a so-called AG-AND type (refer to, for example, FIG. 2 which will be described later) as the configuration of a memory array has been proposed. The memory array configuration of the AG-AND type is such that a MOSFET driven by a gate control signal is connected to the source side of each memory cell of the AND type and the source side is connected to a common source line via the MOSFET. In the memory array configuration of the AG-AND type, to reduce the area of the memory array, the number of bit lines is reduced to one per two memory cells.

The inventors of the present invention have examined the techniques employing the "one sense latch circuit+two SRAM" configuration and the memory array configuration of the AG-AND type for the Y-direct circuit of a flash memory and the memory array and, as a result, clarified the following.

(1) In a memory array configuration in which data is erased on a word line unit basis like the flash memory of the AG-AND type, when the number of bit lines is reduced, a problem occurs such that the unit of writing and the unit of erasing do not coincide with each other. Specifically, when the unit of writing is one page, the unit of erasing is two pages.

(2) The AG-AND type of the hot electron injecting writing method has a problem such that, if there is a depleted bit in a string, rewriting cannot be performed normally. Specifically, when a plurality of depleted memory cells (over-erased cells: threshold voltage of 0V or less) exist on the same bit line in a block, even if one of the depleted cells is selected and the threshold voltage is increased again to 0V or higher, current flows in the other depleted cells so that the threshold voltage of the depleted memory cell cannot be increased to 0V or higher.

(3) The "one sense latch circuit+two SRAMS" configuration has a problem such that the sequence of the "one sense latch circuit+two data latch circuits" configuration cannot be applied. For example, to assure a margin for data in a memory cell and a margin for write data, separate data buffers are necessary.

The inventors herein therefore paid attention to the erasing operation in the memory array configuration such that two pages correspond to and are connected to one word line and got an idea of considering pages to be subjected to erase verification determination and rewriting process and considering page addresses of blocks in the case of simultaneously erasing two or more pages in order to optimize the erasing operation and achieving higher processing speed.

An object of the invention is to provide a nonvolatile semiconductor memory device such as a flash memory realizing optimized erasing operation in a memory array configuration in which a plurality of pages correspond to and are connected to each of a plurality of word lines and higher speed of the erasing operation.

The above and other objects and novel features of the invention will become apparent from the description of the specification and the appended drawings.

DISCLOSURE OF THE INVENTION

An outline of representative ones of inventions disclosed in the specification will be briefly described as follows.

The invention provides a nonvolatile semiconductor memory device comprising a memory array including: a plurality of word lines; a plurality of bit lines; and a plurality of memory cells each connected to a corresponding word line and a corresponding bit line and each having a control gate and a floating gate, the memory array being constituted such that a plurality of blocks are constructed every plural word lines, and a plurality of pages correspond to and are connected to each of the plural word lines. The erasing operation of the nonvolatile semiconductor memory device has the following characteristics.

(1) By providing an erasing mode of performing an erasing operation on at least a first page of the plural pages and an erasing operation on a second page independently of each other in a time sharing manner, and selectively executing erasure verification determination in the erasing operation on one of the first page and the second page, the number of times of erasure verification determination can be suppressed to the minimum.

(2) In (1), the erasing mode further has a rewriting process, and the rewriting process in the erasing operation is performed continuously on the first and second pages. Consequently, it is unnecessary to set a memory cell to be rewritten every rewriting verification determination, so that erroneous upper end determination for erasing can be prevented.

(3) The device has an erasing mode of setting continuous page addresses at least for a first block and a second block in the plurality of blocks, and simultaneously erasing a first page in the first block and a second page in the second block. Thus, the erase unit is increased, so that the erasing rate can be improved.

(4) In (3), the memory array is constructed by a plurality of banks each constructed by a predetermined number of blocks, page addresses are set to be continuous at least in a first block in a first bank and a second block in a second bank among the plurality of banks, and the first page in the first block in the first bank and the second page in the second block in the second bank are simultaneously erased. With the configuration, the erase unit is increased on a memory array bank unit basis, so that the erasing rate can be further improved.

(5) In (3) or (4), the erasing mode further includes erasure verification determination, at least erasure verification determination on a first page in the first block and erasure verification determination on a second page in the second block are made independently of each other in a time sharing manner, and erasure verification determination is performed selectively on one of the first and second pages. Thus, the number of erasure verification determining times can be suppressed to the minimum.

The nonvolatile semiconductor memory device of the invention is a technique necessary for a sequence of an erasing operation in a flash memory or the like in which a block is constructed every plural word lines for the following reason. In the case of a channel hot electron writing method and plural depleted memory cells exist on the same bit line in a block, even if one depleted cell is selected and an attempt is made to increase the threshold voltage again to 0V or higher, current flows in the other depleted cells so that rewriting takes time.

Therefore, as described above, by employing the two-page erasing mode in the memory array having the configuration in which a plurality of pages correspond to and are connected to each word line and selectively making erasure verification determination in the erasing operation on one of the pages, the speed of the erasing operation can be increased. At this time, if the erasure verification determination on one page is made successfully, in consideration of variations in the erasing characteristic, it is also regarded that the erasure verification determination on the other page is also successfully made. Further, by continuously executing the rewriting process in the erasing operation every page, an over-write caused by fluctuations in the threshold voltage of a memory cell can be prevented.

In a memory array in which a plurality of blocks are constructed every plural word lines, by employing the multi-page erasing mode and simultaneously erasing arbitrary word lines in the plurality of blocks, the erasing rate can be improved. At this time, page addresses are scrambled so as to be continuous over blocks.

BEST MODE FOR CARRYING OUT THE INVENTION

Figure 1:
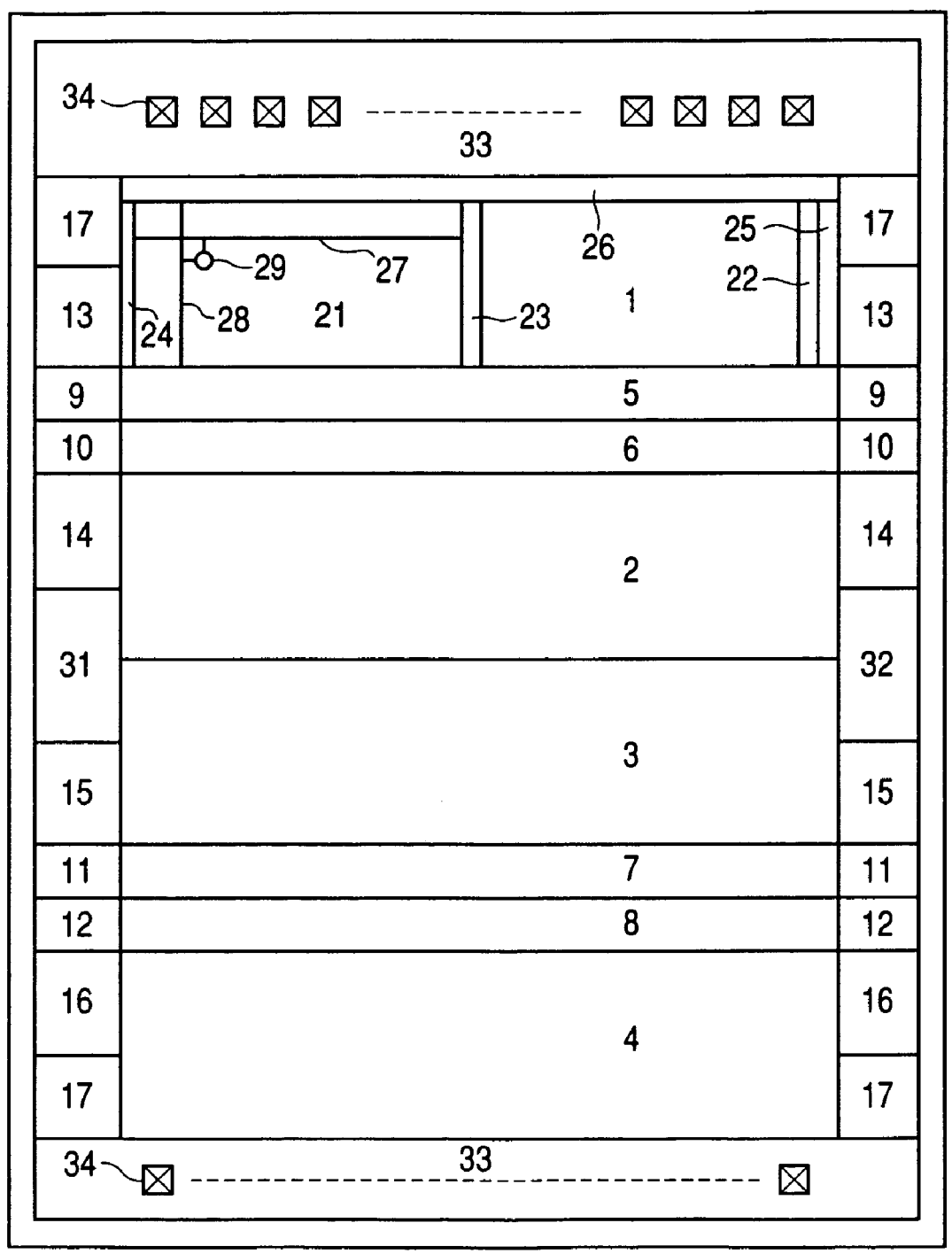
FIG. 1 is a schematic configuration diagram showing a flash memory as an embodiment of a nonvolatile semiconductor memory device of the invention.

Embodiments of the invention will be described in detail hereinbelow with reference to the drawings. In all of the diagrams for explaining the embodiments, the same reference numerals are designated to members having the same functions and their repetitive description will not be given.

An example of the configuration of a flash memory as an embodiment of a nonvolatile semiconductor memory device of the invention will be described with reference to FIG. 1.

The flash memory of the embodiment is, although not limited, as an example, a flash memory capable of storing data of a plurality of bits as threshold voltages in each of memory cells and constructed by a plurality of banks which can operate independently of each other. The flash memory includes four banks 1 to 4, sense latch columns 5 to 8 corresponding to the banks 1 to 4, Y-direct circuits 9 to 12, SRAMs 13 to 16, and indirect circuits 17. Circuit elements constructing those circuits are formed on a single semiconductor substrate made of single crystal silicon by a known semiconductor integrated circuit manufacturing technique.

Each of the banks 1 to 4 includes a memory array 21, three sub-decoders 22 to 24 disposed in the center in the Y direction (=word line direction) of the memory array 21 and on the outside, a main decoder 25 disposed on the outside of the sub-decoder 22, and one gate decoder 26 disposed on the outside in the X direction (=bit line direction) of the memory array 21. The memory array 21 is constructed by a plurality of memory lines in which a plurality of memory cells 29 connected to a plurality of word lines 27 and a plurality of bit lines 28 and each having a control gate and a floating gate are connected in parallel (the details will be described later). In accordance with a decoding result, the sub-decoders 22 to 24, main decoder 25, and gate decoder 26 set one word line 27 connected to an arbitrary memory cell 29 in each memory array 21 to the selection level.

The sense latch lines 5 to 8 are disposed so as to be adjacent to the banks 1 to 4, respectively, and sandwiched between the banks 1 and 2 and between the banks 3 and 4. The sense latch lines 5 to 8 sense the level of the bit line 28 at the time of reading and apply a potential according to write data at the time of writing. The Y-direct circuits 9 to 12 are disposed in the peripheral portion of the chip so as to be adjacent to the sense latch lines 5 to 8. The Y-direct circuits 9 to 12 employ the single end sense method (NMOS gate reception sense method) of which details will be described later and transfer write data and read data. The SRAMs 13 to 16 are disposed in the peripheral portion of the chip so as to be adjacent to the Y-direct circuits 9 to 12, respectively. The SRAMs 13 to 16 hold write data and read data.

The indirect circuits 17 are disposed in the peripheral portion of the chip. The indirect circuit 17 includes a control circuit 31 for controlling the erasing operation, writing operation, reading operation, and the like, a power source circuit 32 for generating various voltages necessary for the operations, and an input/output circuit 33 for receiving an address signal, write data, a command, a control signal, and the like input from the outside, supplying them to internal circuits, and outputting read data. The input/output circuit 33 has a plurality of pads 34 disposed on the outside in the X direction of the peripheral portion of the chip and serving as external terminals connected to the outside.

An example of the configuration of a memory array in the flash memory of the embodiment will be described with reference to FIG. 2. The memory array in the flash memory of the embodiment has, although not limited, for example, a memory array configuration called the AG-AND type. The invention can be also applied to various memory array configurations such as the AND type and the NAND type. Obviously, the invention can be also applied to a flash memory in which the threshold voltage is set in two levels to store binary data, the threshold voltage is set in four levels to store data of four values, or the threshold voltage is set in three levels or five or higher levels to store multi-value data in each memory cell.

Figure 2:
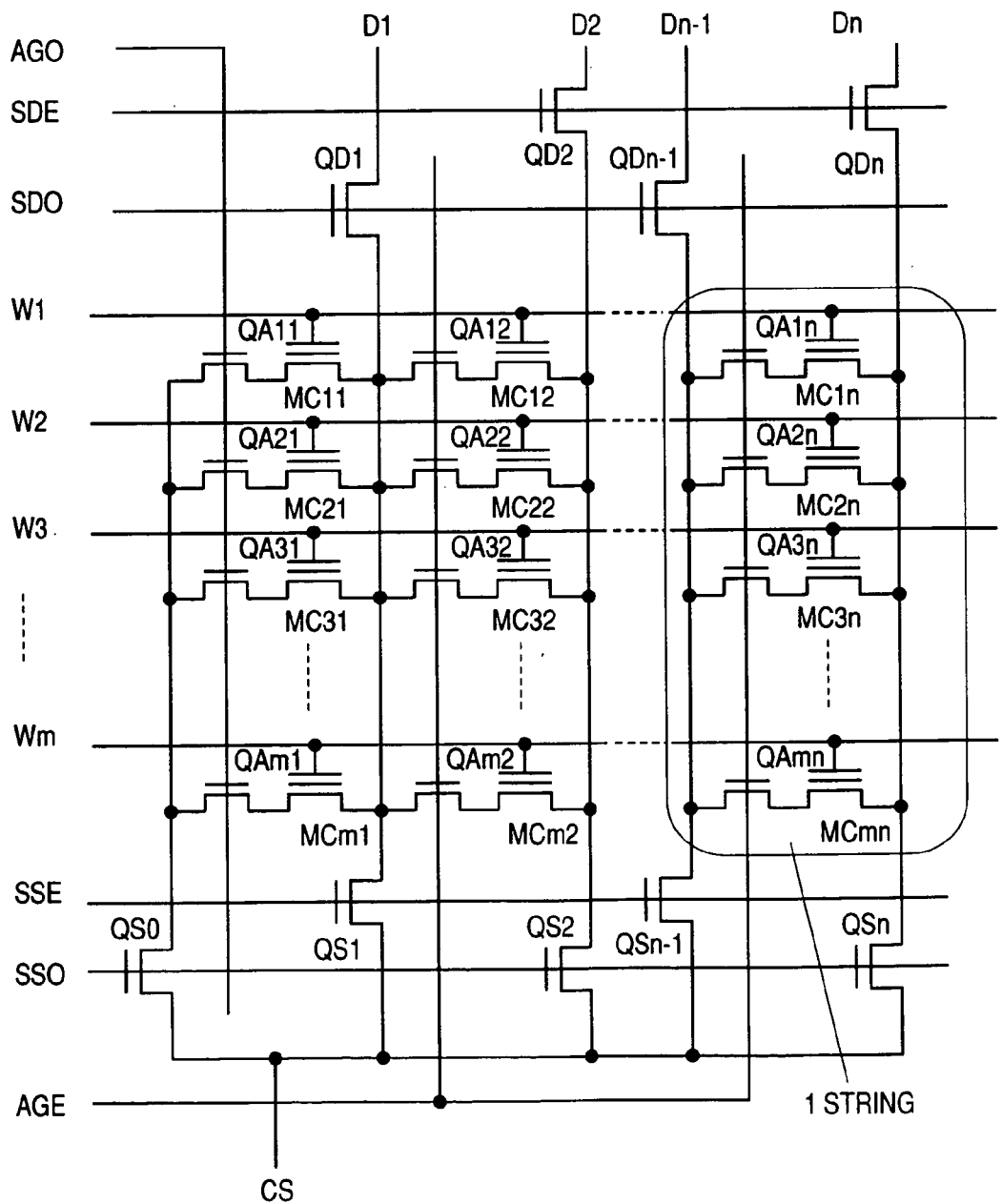
FIG. 2 is a circuit diagram showing a main portion of a memory array in the flash memory of the embodiment of the invention.

FIG. 2 shows one of the blocks in the memory array. The block is constructed by a part of a bank and is in a unit of a plurality of strings. A string is a unit of a plurality of memory cells in a memory line connected to a bit line.

In the memory array, a plurality of strings are arranged in parallel in the word line direction in one block. In one string, a plurality of memory cells are connected and disposed in parallel in the bit line direction. The diagram shows the case where "m" word lines W1 to Wm, "n" bit lines D1 to Dn, "n" strings, and m×n memory cells MC11 to MCmn are provided per block. In short, "m" memory cells are disposed per string.

For example, in a memory line constructed by "m" memory cells MC11 to MCm1 in one string, the gates of the memory cells MC11 to MCm1 are connected to the word lines W1 to Wm, respectively, and the drains of the memory cells MC11 to MCm1 are commonly connected to a local drain line, connected to the bit line D1 via a drain-side selection MOSFET QD1 driven by a signal of a drain-side control signal line SDO, and connected to a common source line CS via a source-side selection MOSFET QS1 driven by a signal of a source-side control signal line SSE. In the memory line, the sources are commonly connected via AG MOSFETs QA11 to QAm1 driven by a signal of a gate control signal line AGO, and are connected to the common source line CS via a source-side selection MOSFET QS0 driven by a signal of a source-side control signal line SSO.

In a memory line constructed by memory cells MC12 to MCm2 adjacent to the above-described memory line, the gates of the memory cells MC12 to MCm2 are connected to the word lines W1 to Wm, respectively, and the drains of the memory cells MC12 to MCm2 are commonly connected to a local drain line, connected to the bit line D2 via a drain-side selection MOSFET QD2 driven by a signal of a drain-side control signal line SDE, and connected to a common source line CS via a source-side selection MOSFET QS2 driven by a signal of a source-side control signal line SSO. In the memory line, the sources are commonly connected via AG MOSFETs QA12 to QAm2 driven by a signal of the gate control signal line AGE, connected to the bit line D1 via the drain-side selection MOSFET QD1 driven by a signal of the drain-side control signal line SDO, and are connected to the common source line CS via the source-side selection MOSFET QS1 driven by a signal of the source-side control signal line SSE.

Similarly, in an odd-numbered memory line, like the memory line constructed by the memory cells MC11 to MCm1, each memory cell MC is connected to a word line W and a bit line D and is connected so as to be driven by signals of the drain-side control signal line SDO, source-side control signal line SSE, gate control signal line AGO, and source-side control signal line SSO. In an even-numbered memory line, like the memory line constructed by the memory cells MC12 to MCm2, each memory cell MC is connected to a word line W and a bit line D and is connected so as to be driven by signals of the drain-side control signal line SDE, source-side control signal line SSO, gate control signal line AGE, drain-side control signal line SDO, and source-side control signal line SSE.

In the configuration of the memory array, the word lines W1 to Wm are connected to a sub decoder and a main decoder. One word line W in each memory array is selected in accordance with decoding results of the sub decoder and the main decoder, and a predetermined voltage is applied to the selected word line W in each of the operations of reading, writing, and erasing the word line W. In the reading, writing, and erasing operations, a predetermined voltage is supplied to not only the word line W but also each of the bit line D, drain-side control signal lines SDO and SDE, source-side control signal lines SSE and SSO, and gate control signal lines AGO and AGE, and a predetermined voltage is applied to the drain and source of the memory cell MC.

Figure 3:
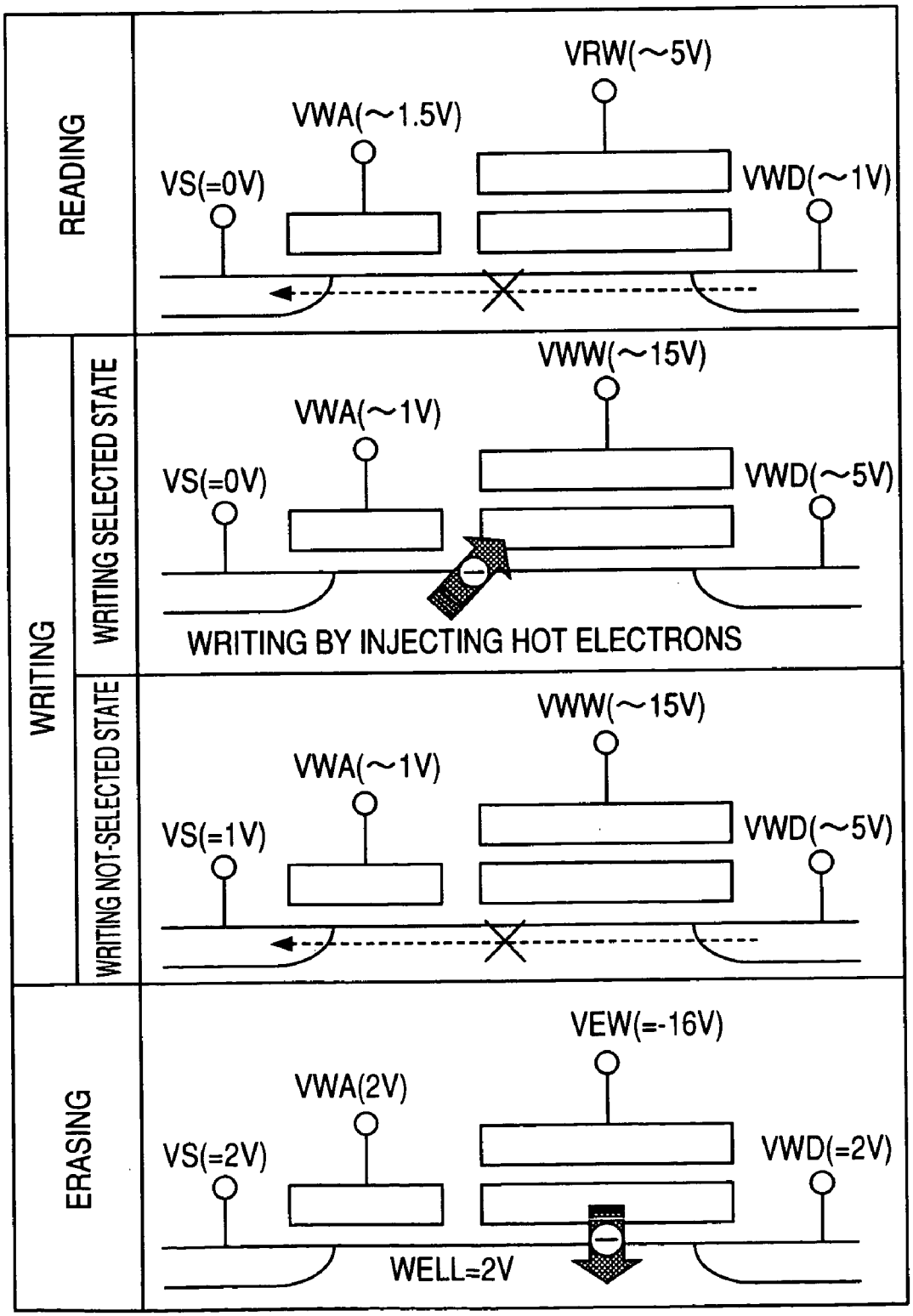
FIG. 3 is a diagram illustrating a state of application of voltages to memory cells in reading, writing, and erasing operations.

Referring to FIG. 3, an example of an application state of voltages to a memory cell in the reading, writing and erasing operations will be described.

In the reading operation, a read voltage VRW (for example, about 5V) is applied to the word line W to which a memory cell MC to be selected is connected. A bit line D corresponding to the memory cell MC to be selected is precharged to a potential such as a voltage VWD (for example, about 1V). A drain-side selection MOSFET QD on a local drain line to which the memory cell MC to be selected is connected and a source-side selection MOSFET QS corresponding to the drain-side selection MOSFET QD are set in an ON state. A voltage VWA (for example, about 1.5V) is applied to an AG MOSFET QA to turn the AG MOSFET QA on and a voltage VS (for example, 0V) of the common source line CS is applied.

In the writing operation, a voltage VWW (for example, about 15V) is applied to the word line W to which the memory cell MC to be selected is connected, the bit line D corresponding to the memory cell MC to be selected is pre-charged to the voltage VWD (for example, about 5V). The drain-side selection MOSFET QD on a local drain line to which the memory cell MC to be selected is connected and the source-side selection MOSFET QS corresponding to the drain-side selection MOSFET QD are set in an ON state. The voltage VWA (for example, about 1V) is applied to the AG MOSFET QA to turn the AG MOSFET QA on and the voltage VS (for example, 0V) of the common source line CS is applied. As described above, by applying a high voltage to the control gate to generate tunnel current and injecting hot electrons into the floating gate, the threshold voltage is set to a high state. To a memory cell MC which is not selected, the voltage VS (for example, 1V) is applied to the common source line Cs.

In the erasing operation, by applying an erase voltage VEW (for example, −16V) to the word line W selected for erasure, batch erasing can be performed on the word line unit basis. In a data erasing operation, the drain-side selection MOSFET QD and the source-side selection MOSFET QS in a block including the word line W selected for erasure are turned on. Further, by application of the voltage VWA (for example, about 2V), the AG MOSFET QA is turned on. The voltage VWD (for example, 2V) is applied to the drain of the memory cell MC in the selected block and the voltage VS (for example, 2V) is applied to the source. At this time, 2V is applied to the well region. By applying a negative voltage to the control gate, charges are extracted from the floating gate by the tunnel current to set the threshold voltage into a low state.

An example of the Y-direct circuit in the flash memory of the embodiment will now be described with reference to FIG. 4. The Y-direction circuit in the flash memory of the embodiment employs, although not limited, both the so-called single end sense method and the so-called NMOS gate reception sense method. The single end sense method is a method of disposing a sense latch circuit at one end of a global bit line (bit line) and detecting a voltage on the global bit line according to the threshold voltage of a memory cell by the sense latch circuit. The NMOS gate reception sense method is a method of receiving data on a global bit line by the gate of an NMOSFET connected between the global bit line and the sense latch circuit and driving the node of the sense latch circuit.

Figure 4:
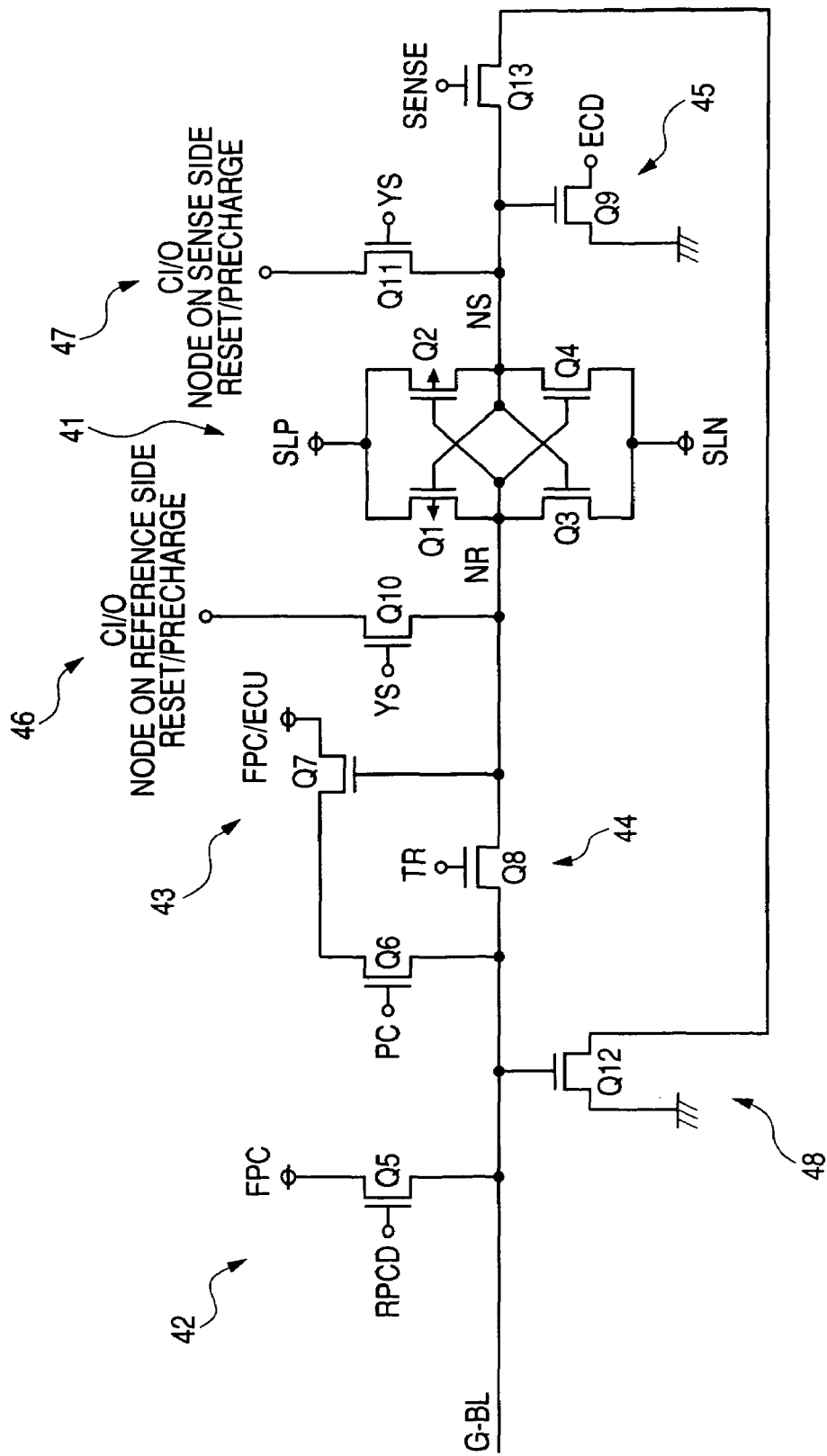
FIG. 4 is a circuit diagram showing a Y-direct circuit of a single end sense method (NMOS gate reception sense method)

As shown in FIG. 4, the Y-direct circuit employing both the single end sense method and the NMOS gate reception sense method includes a sense latch circuit 41, a global bit line precharge/discharge circuit 42 connected on a global bit line connected to the sense latch circuit 41, a global bit line selective/batch precharge/discharge determining circuit 43, a transfer circuit 44, a batch precharge/discharge determining circuit 45, Y-selection switch/sense latch node control circuits 46 and 47, and an NMOS gate reception sense circuit 48.

A global bit line connected to the sense latch circuit 41 corresponds to the bit line shown in FIG. 2. By the global bit line G-BL, the memory cell and the sense latch circuit 41 are connected via, as shown in FIG. 2, the drain-side selection MOSFET driven by signals of the drain-side control signal lines SDO and SDE and the source-side selection MOSFET driven by signals of source-side control signal lines SSE and SSO. Since the capacitance per line is a large value such as 0.3 pF, the global bit line G-BL can be used as a temporary saving place of memory cell data.

The sense latch circuit 41 senses the threshold state of a memory cell, latches the sensed data, and holds information of a memory cell to be written. The sense latch circuit 41 has a circuit format of a latch type (gate and drain crossing type) of a CMOS configuration constructed by two PMOSFETs Q1 and Q2 and two NMOSFETs Q3 and Q4. The high potential side of the PMOSFETs Q1 and Q2 is connected to a signal line SLP, and the low potential side of the NMOSFETs Q3 and Q4 is connected to a signal line SLN. In the following description and drawings, the sense latch 41 will be also abbreviated as SL.

Figure 5:
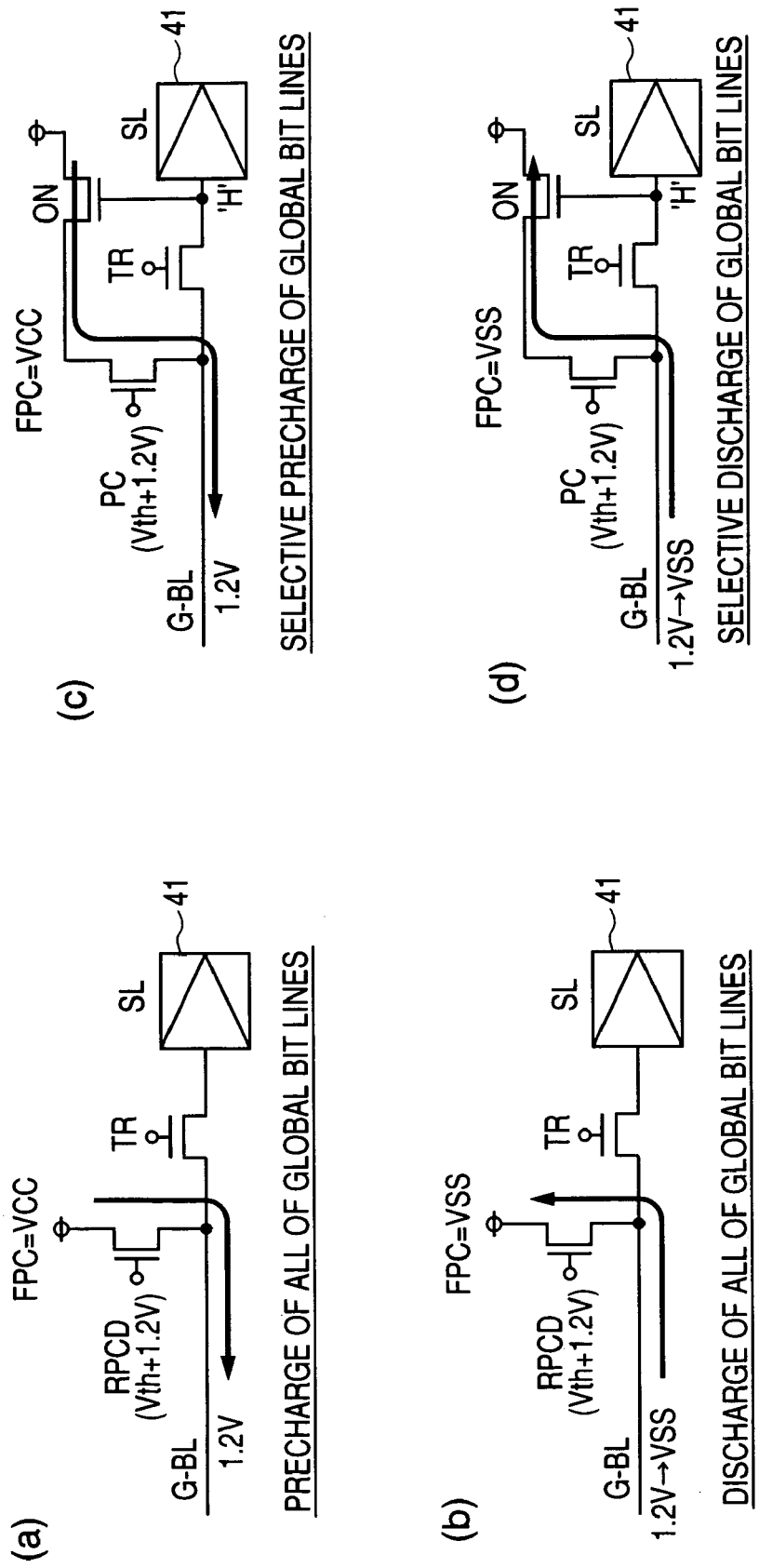
FIGS. 5A to 5D are diagrams showing operations of precharging/discharging a global bit line.

The global bit line precharge/discharge circuit 42 is a circuit having both the function of precharging all of global bit lines G-BL (batch precharging) and the function of discharging all of the global bit lines G-BL (batch discharging). The global bit line precharge/discharge circuit 42 is made by one NMOSFET Q5 and is connected between the global bit line G-BL and a signal line FPC. The gate is connected to a signal line RPCD and driven. The batch precharge/discharge operation of the global bit line G-BL will be described later with reference to FIG. 5.

The global bit selective/batch precharge/discharge determining circuit 43 is a circuit having the function of performing selective precharging/discharging on the global bit line G-BL unit basis and the function of performing batch precharging/discharging of data latched by the sense latch circuit 41. The global bit line selective/batch precharge/discharge determining circuit 43 is constructed by connecting two NMOSFETs Q6 and Q7 and is connected between the global bit line G-BL and the signal line FPC/ECU. The gate of the NMOSFET Q6 is connected to a signal line PC and driven, and the gate of the NMOSFET Q7 is connected to the global bit line G-BL and driven. The operation of selective precharging/discharging the global bit line G-BL will be described later by referring to FIG. 5.

In the global bit line selective/batch precharge/discharge determining circuit 43, when the NMOSFET Q6 is turned on by a signal on the signal line PC to supply a potential ECU to the signal line FPC/ECU, and the NMOSFET Q5 is turned on by the signal of the signal line RPCD in the global bit line precharge/discharge circuit 42 to supply the potential VSS to the signal line FPC, the voltage level "H" or "L" of a node NR of the sense latch circuit 41 to which the gate of the NMOSFET Q7 is connected can be determined.

The transfer circuit 44 is a circuit for connecting/disconnecting the sense latch circuit 41 and the global bit line G-BL. The transfer circuit 44 is constructed by one NMOSFET Q8 and connected between the global bit line G-BL and the node NR as one (on the global bit line side) of the nodes of the sense latch circuit 41, and the gate is connected to a signal line TR and driven. The transfer circuit 44 can be used to turn on the NMOSFET Q8 by the signal of the signal line TR and supply a write select/block voltage. The source of the write select/block voltage has the potential of the signal line SLP on the high potential side or the potential of the signal line SLN on the low potential side of the sense latch circuit 41.

The batch precharge/discharge determining circuit 45 is a circuit for determining batch precharge/discharge on data latched by the sense latch circuit 41. The batch precharge/discharge determining circuit 45 is constructed by one NMOSFET Q9 and is connected between a signal line ECD and the ground potential. The gate is connected to the other node NS (on the side opposite to the global bit line) of the sense latch circuit 41 and is driven. The batch precharge/discharge determining circuit 45 can determine the voltage level of "H" or "L" of the node NS of the sense latch circuit 41 to which the gate of the NMOSFET Q9 is connected.

Each of the Y selection switch/sense latch node control circuits 46 and 47 is a circuit having the switching function of inputting/outputting data between the sense latch circuit 41 and a common input/output line CI/O and the function of resetting/precharging the node of the sense latch circuit 41. Each of the Y selection switch/sense latch node control circuits 46 and 47 is constructed by two NMOSFETs Q10 and Q11 connected to nodes NR and NS on both sides of the sense latch circuit 41. For example, the NMOSFET Q10 on the reference side is connected between the node NR as one of nodes of the sense latch circuit 41 and the common input/output line CI/O, and its gate is connected to a signal line YS and driven. For example, the other NMOSFET Q11 on the sense side is connected between the other node NS of the sense latch circuit 41 and the common input/output line CI/O and its gate is connected to the signal line YS and driven. By a signal of the signal line YS, the NMOSFETs Q10 and Q11 are turned on so that data can be transmitted between the SRAM and the sense latch circuit 41. A signal of the signal line YS is input from a Y address decoder.

In the Y-selection switch/sense latch node control circuits 46 and 47, the NMOSFETs Q10 and Q11 are turned on by the signal of the signal line YS. When the potential VCC is supplied to the common input/output line CI/O, the node of the sense latch circuit 41 can be precharged. When the potential VSS is supplied to the common input/output line CI/O, the node of the sense latch circuit 41 can be discharged. The discharge can be used at the time of clearing data in the sense latch circuit 41.

The NMOS gate reception sense circuit 48 is a circuit having both of the function of performing the sensing operation and the function of setting a state where a signal amount of the node of the sense latch circuit 41 is sufficiently assured in order to prevent erroneous operation of the sense latch circuit 41. The NMOS gate reception sense circuit 48 is constructed by connecting two NMOSFETs Q12 and Q13 and is connected between the other node NS of the sense latch circuit 41 and the ground potential. The gate of the NMOSFET Q12 is connected to the global bit line G-BL and driven. The gate of the other NMOSFET Q13 is connected to a signal line SENSE and driven. In the NMOS gate reception sense circuit 48, the NMOSFET Q13 is turned on by a signal of the signal line SENSE and the potential of the global bit line G-BL to which the gate of the NMOSFET Q12 is connected can be sensed. In the state where the NMOSFET Q13 is open, when the global bit line G-BL is at the "H" level, "H" is sensed, and when the global bit line G-BL is at the "L" level, "L" is sensed.

An example of the operation of precharging/discharging a global bit line will be described with reference to FIGS. 5A to 5D. FIGS. 5A to 5D show precharge of all of global bit lines, discharge of all of global bit lines, selective precharge of global bit lines, and selective discharge of global bit lines, respectively.

As shown in FIG. 5A, all of global bit lines can be precharged by setting the potential of the signal line FPC for supplying the source voltage to be different from the potentials VCC and VSS in the global bit line precharge/discharge circuit 42. Specifically, the potential VCC is supplied to the signal line FPC and the MOSFET Q5 is turned on by a signal of the signal line RPCD to precharge the global bit lines G-BL in a lump. For example, in the case where the potential of the signal line RPCD is set to (Vth+1.2V), the global bit line is precharged to 1.2V.

As shown in FIG. 5B, all of global bit lines are discharged in a lump by supplying the potential VSS to the signal line FPC and turning on the MOSFET Q5 by the signal of the signal line RPCD in the global bit line precharge/discharge circuit 42. For example, in the case where the potential of the signal line RPCD is set to (Vth+1.2V), the global bit line is discharged from 1.2V to VSS.

As shown in FIG. 5C, global bit lines can be selectively precharged by setting the potential of the signal line FPC for supplying the source voltage to be different from the potential VCC/VSS in the global bit line selective/batch precharge/discharge determining circuit 43. At the time of selection, the node of the sense latch circuit 41 (SL) is at the "H" voltage level, so that the MOSFET is in an on state. Specifically, the potential VCC is supplied to the signal line FPC and the MOSFET Q is turned on by a signal of the signal line PC to selectively precharge the global bit lines G-BL. For example, in the case where the potential of the signal line PC is set to (Vth+1.2V), the global bit line is precharged to 1.2V.

As shown in FIG. 5D, global bit lines are selectively discharged by supplying the potential VSS to the signal line FPC and turning on the MOSFET Q by the signal of the signal line PC in the global bit line selective/batch precharge/discharge circuit 43. For example, in the case where the potential of the signal line PC is set to (Vth+1.2V), the global bit line G-BL is discharged from 1.2V to VSS.

An example of the data transfer circuit in the flash memory of the embodiment will be described with reference to FIG. 6. The data transfer circuit in the flash memory of the embodiment employs, although not limited, for example, the so-called the "one sense latch circuit+two SRAMs" configuration.

Figure 6:
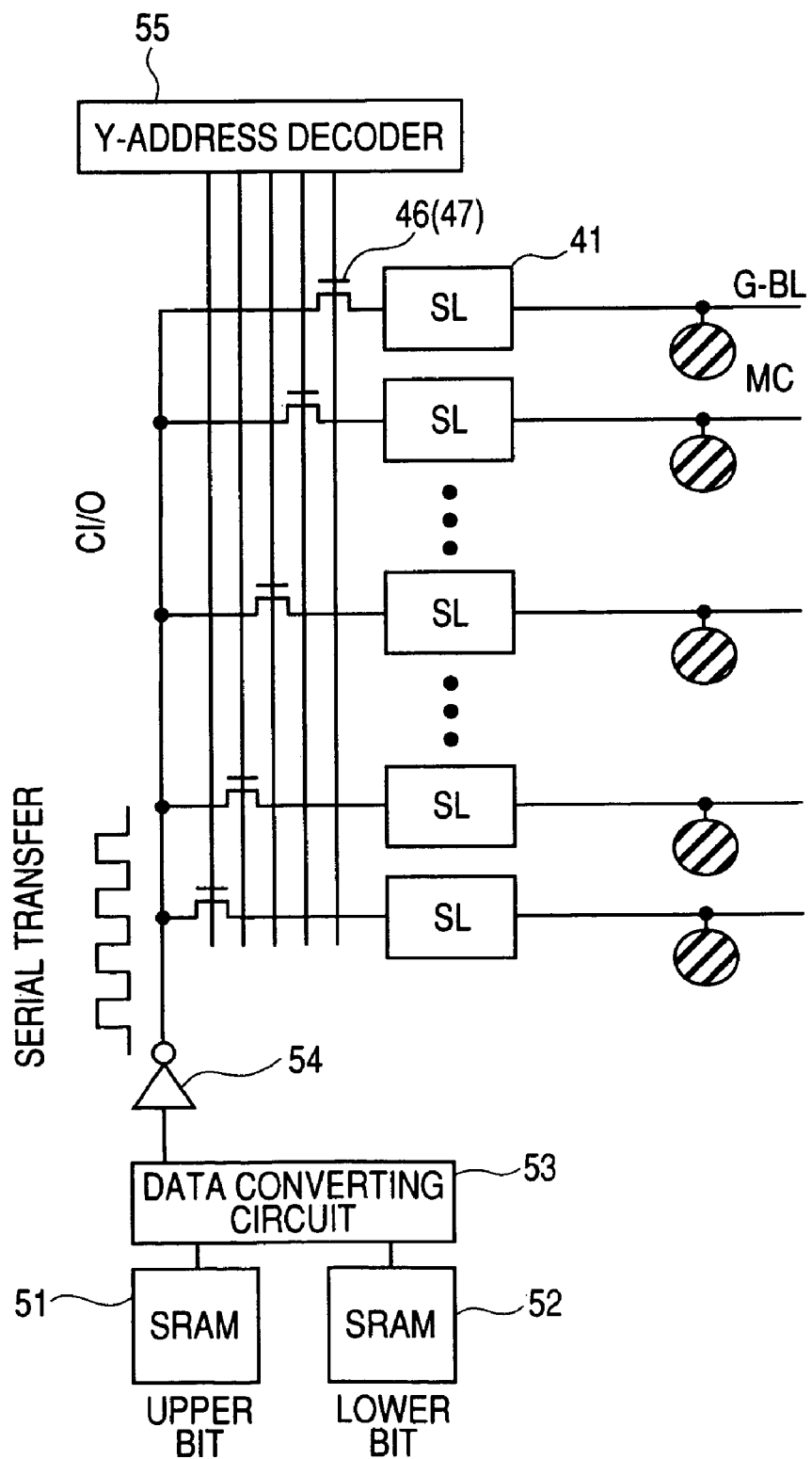
FIG. 6 is a configuration diagram showing a data transfer circuit.

As shown in FIG. 6, the data transfer circuit employing the "one sense latch circuit+two SRAMs" configuration includes: the sense latch circuit 41 (SL) disposed at one end of the global bit line G-BL to which the memory cells MC are connected; the common input/output line CI/O to which each of nodes of the sense latch circuit 41 is connected via an NMOSFET of the Y-selection switch/sense latch node control circuit 46 (47); SRAMs 51 and 52 for storing an upper bit and a lower bit of write data; a data converting circuit 53 connected to the SRAMs 51 and 52; and a main amplifier 54 connected between the data converting circuit 53 and the common input/output line CI/O. The NMOSFET of the Y-selection switch/sense latch node control circuit 46 (47) is driven in accordance with a result of decoding of a Y address decoder 55.

In the data transfer circuit, the two SRAMs 51 and 52 are assigned to the plurality of sense latch circuits 41 in a bank. Data of the upper and lower bits stored in the SRAMs 51 and 52 is selected by the data converting circuit 53 and converted from multivalue data to binary data. After that, the binary data is transferred serially to the common input/output line CI/O via the main amplifier 54. Further, each binary data serially transferred is held in each of the sense latch circuits 41 and is written into a memory cell MC.

For example, one bit of two-bit data (generally, write data) input from the data input/output terminal is stored in one of the two SRAMs 51 and 52 and the other bit is stored in the other SRAM. In the case of serially transferring data from the two SRAMs 51 and 52 to the sense latch circuit 41 via the common input/output line CI/O, an arbitrary set from four sets of two-bit data ("00", "10", "11", and "01") can be selectively transferred. For example, in the case of transferring "11", only "11" is transferred as "H" data and the other data is transferred as "L" data.

In the data transfer circuit, in the reading operation, read data from each memory cell MC is held in each of the sense latch circuits 41. Further, data is transferred from the sense latch circuits 41 to the SRAMs 51 and 52 and the upper bit and the lower bit are stored into the SRAMs 51 and 52, respectively.

An example of the data synthesizing circuit of the upper and lower bits stored in the SRAMs will be described with reference to FIGS. 7 and 8.

Figure 7:
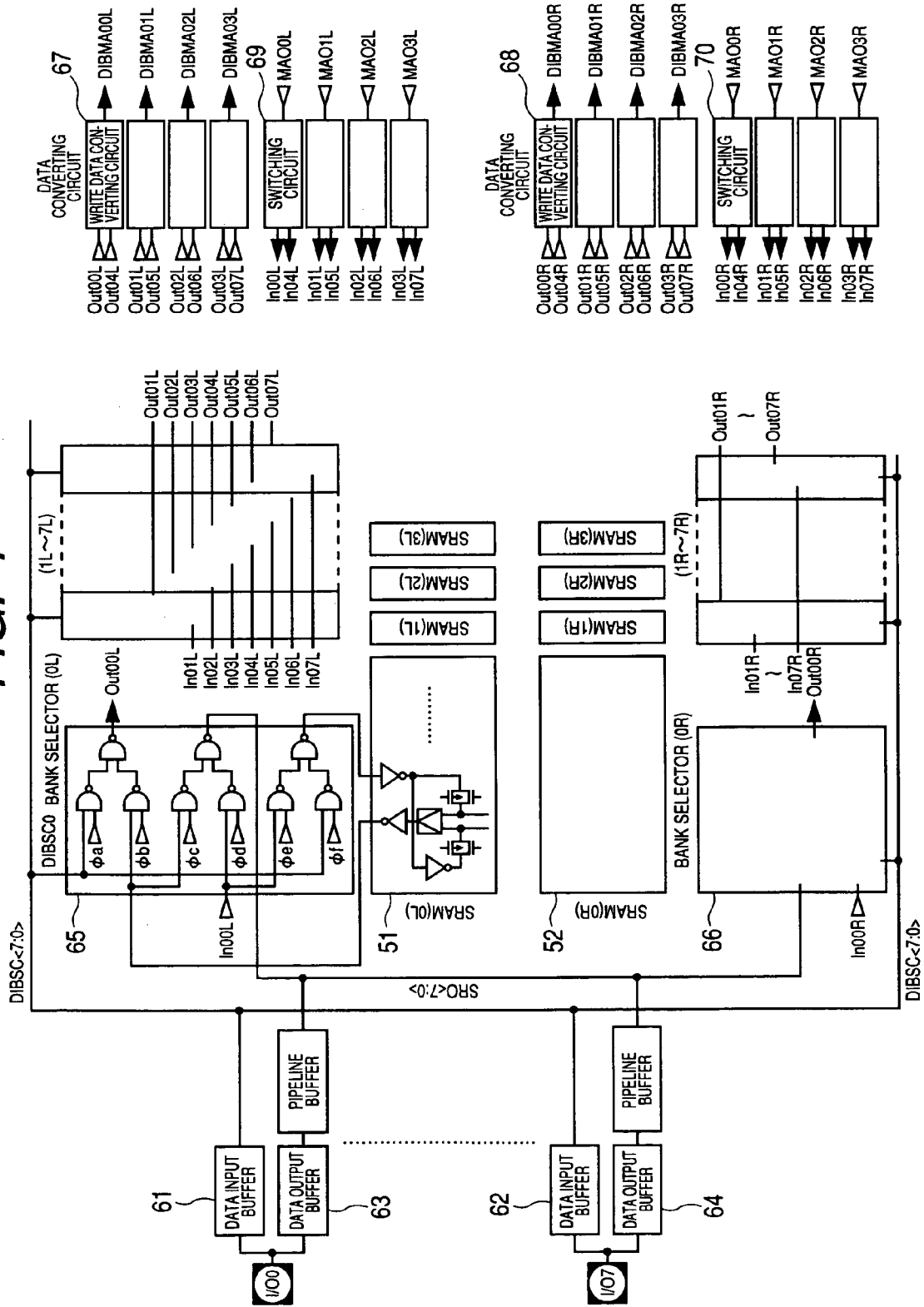
FIG. 7 is a circuit diagram showing a data synthesizing circuit.
Figure 8:
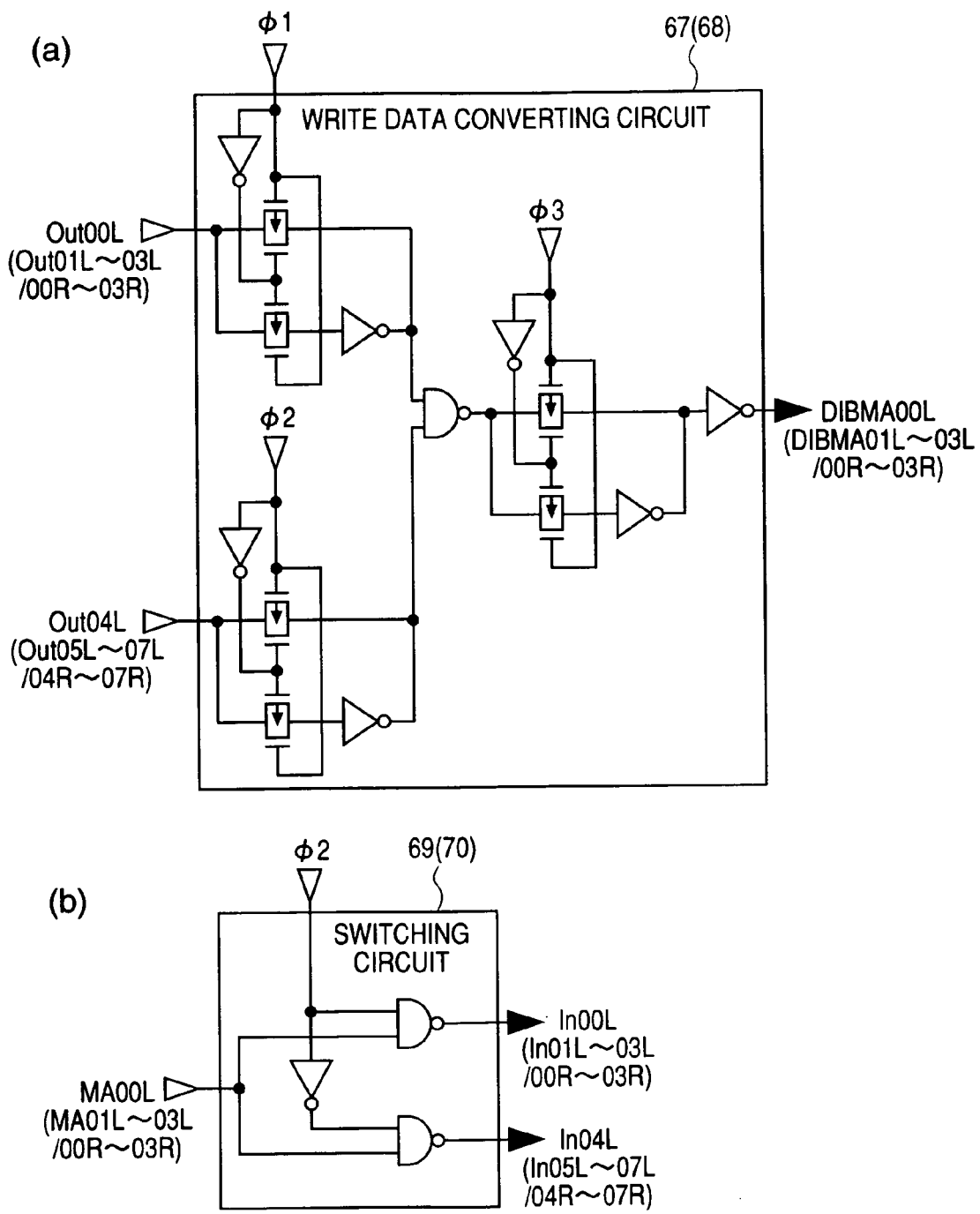
FIGS. 8A and 8B are circuit diagrams showing a write data converting circuit and a switching circuit.

As shown in FIG. 7, the data synthesizing circuit is constructed by bank selectors 65 and 66 connected to data input buffers 61 and 62 and data output buffers 63 and 64 linked to the data input/output terminals I/O, the SRAMs 51 and 52 connected to the bank selectors 65 and 66, and the data converting circuit 53 connected to the bank selectors 65 and 66. The data converting circuit 53 is constructed by write data converting circuits 67 and 68 and switching circuits 69 and 70.

In the data synthesizing circuit, the two bank selectors 65 (66), one write data converting circuit 67 (68) and one switching circuit 69 (70) are assigned to each SRAM 51 (52). Each of the components operates according to an operation mode selected by the bank selector 65 (66) constructed by a plurality of NAND gates. Further, a write data converting selection mode is set by the write data converting circuit 67 (68) constructed by a plurality of pass gates, NAND gates, and inverters shown in FIG. 8A. A mode of selecting high-order data and low-order data is set by the switching circuit 69 (70) made by an NAND gate and an inverter shown in FIG. 8B.

In each bank selector 0L (1L to 7L and 0R to 7R) signals of a signal line DIBSC0 (DIBSC1 to DIBSC7) and a signal line In00L (In01L to In07L and IN00R to In07R) are used as inputs, and an operation mode is selected according to control signals φa to φe and output via a signal line Out00L (Out01L to Out07L and Out00R to Out07R) The operation modes include, for example, transfer from data input/output terminal to SRAM/sense latch circuit, transfer from data input/output terminal to SRAM, transfer from SRAM to sense latch circuit, transfer from sense latch circuit to SRAM, transfer from sense latch circuit to data input/output terminal, and transfer from SRAM to data input/output terminal.

Write data is converted in each write data converting circuit 0L (1L to 3L and 0R to 3R). Signals of the signal line Out00L and Out04L (Out01L to Out03L, Out05L to Out07L/ Out00R to Out07R) are used as inputs, write data conversion is selected according to control signals φ1 to φ3, and data is output via a signal line DIBMA00L (DIBMA01L to DIBMA03L/DIBMA00R to DIBMA03R). A signal line DIBMA* is connected to the main amplifier 54. In the write data conversion, for example, at the time of writing "01", the data "0" (the high-order data of the input/output terminal is "0" and the low-order data is "1") is converted to an output (DIBMA*) "0" and the other data is converted to "1". At the time of writing "00" or "10", the write data conversion is similarly performed.

The high-order and low-order data is selected as follows. In each switching circuit 0L (1L to 3L/0R to 3R), a signal of a signal line MA00L (MA01L to MA03L/MA00R to MA07R) is used as an input, transfer of high-order data and low-order data is selected according to a control signal φ4, and the selected data is output via signal lines In00L and In04L (In01L to In03L, In05L to In07L/In00R to In07R). The signal line MA* is connected to the main amplifier 54. In selection of the high-order data and the low-order data, "H" is set at the time of transferring the high-order data, and "L" is set at the time of transferring the low-order data. The high-order data is transferred to data input/output terminals I/O4 to I/O7 via signal lines In*4 to In*7. The low-order data is transferred to data input/output terminals I/O0 to I/O3 of the SRAM via signal lines In*0 to In*3.

An example of the reading operation in the flash memory of the embodiment will be described with reference to FIGS. 9 to 11. The reading operation is performed in, although not limited, for example, a multi-value (four-value) reading mode shown in FIG. 9 and a binary data reading mode shown in FIG. 10.

Figure 11:
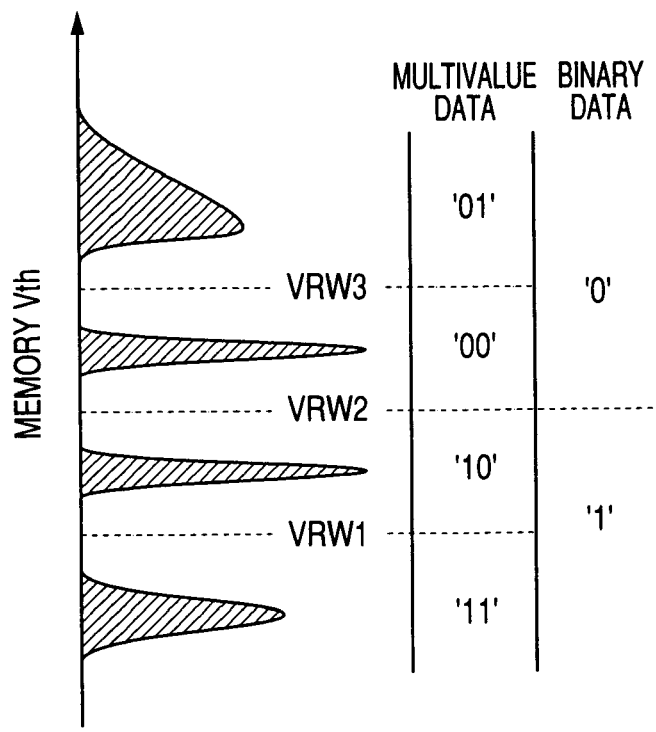
FIG. 11 is a diagram showing the relation between a threshold voltage distribution and a read voltage of a memory cell.

In the reading modes, the relation between the threshold voltage distribution of a memory cell and the read voltage is as shown in FIG. 11. For the multi-value data, a read voltage VRW1 is set between the "11" distribution and the "10" distribution, a read voltage VRW2 is set between the "10" distribution and the "00" distribution, and a read voltage VRW3 is set between the "00" distribution and the "01" distribution. For the binary data, the read voltage VRW2 is set between the "1" distribution and the "0" distribution.

In the reading mode, in the "one sense latch circuit+two SRAMs" configuration, data calculation is executed between the sense latch circuit 41 (SL) and the global bit line G-BL, and data of the upper and lower bits is temporarily stored in the sense latch circuit 41. Further, the upper bit and the lower bit of the read data stored in the sense latch circuit 41 are transferred to the SRAMs 51 and 52, respectively. At the time of transfer, the lower-bit data in the two-bit data is synthesized. The read data stored in the SRAMs 51 and 52 is output to the data input/output terminal I/O synchronously with an external serial clock. The details will be described in order hereinbelow with reference to FIGS. 9 and 10.

Figure 9:
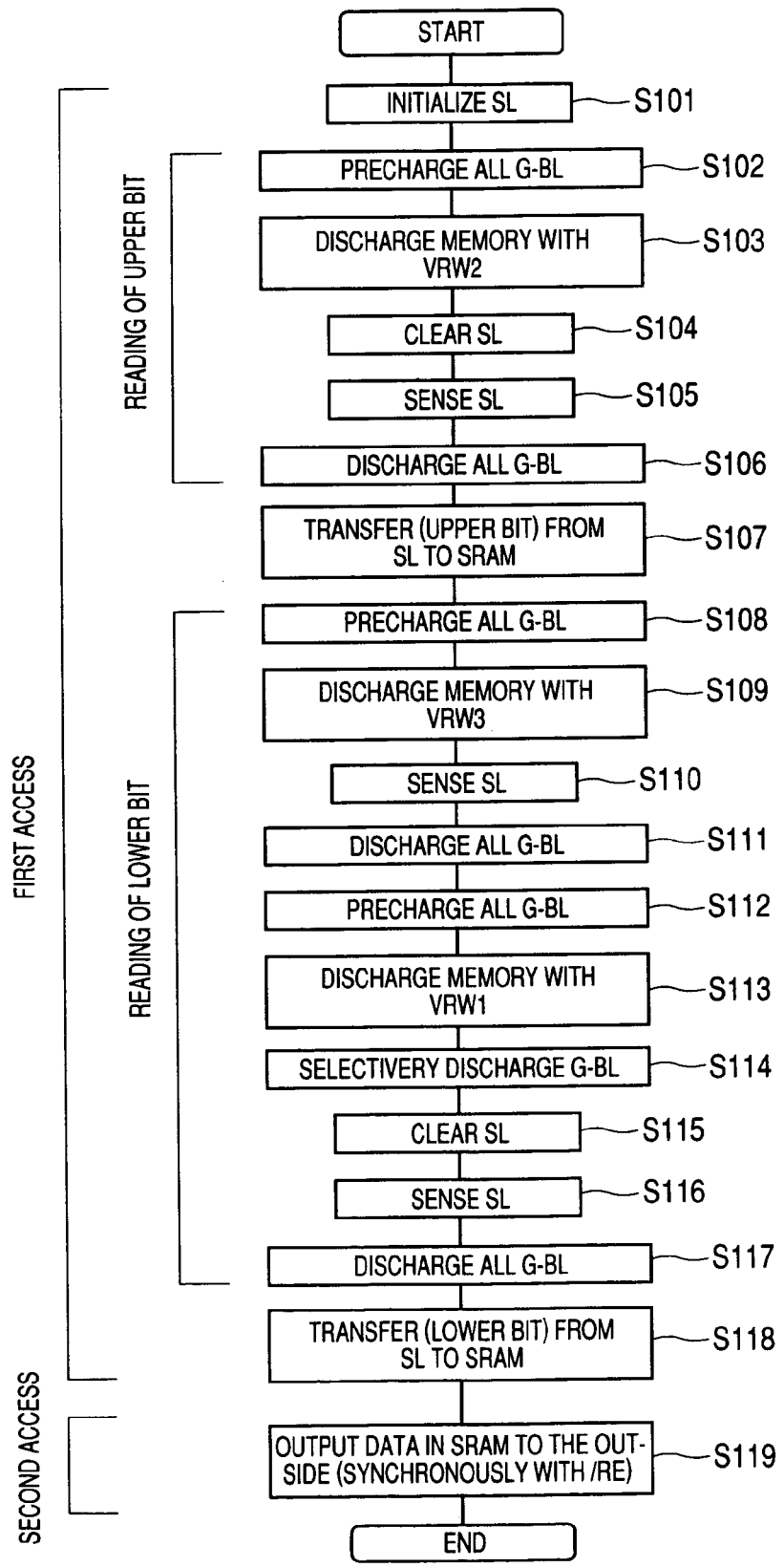
FIG. 9 is a flowchart showing a multi-value reading mode.

As shown in FIG. 9, the multi-value reading mode includes a first access process and a second access process. In the first access process, the sense latch circuit is initialized (step S101) and, after that, reading of the upper bit, transfer of the upper bit, reading of the lower bit, and transfer of the lower bit are sequentially performed.

(1) In the first access process, in reading of the upper bit, all of global bit lines are precharged and, after that, a memory cell is discharged (steps S102 and S103). At the time of discharging the memory cell, the read voltage VRW2 is applied to a word line connected to a selected memory cell.

The node of the sense latch circuit is cleared and, after that, data on the global bit line is sensed and latched by the sense latch circuit (steps S104 to S106) After that, all of the global bit lines are discharged.

(2) In transfer of the upper bit, the data held in the sense latch circuit is transferred and stored into the SRAM (step S107). At this time, the data is stored as the data of the upper bit in the SRAM for the upper bit.

(3) In reading of the lower bit, in a manner similar to reading of the upper bit, all of global bit lines are precharged, a memory cell is discharged (VRW3), the sense latch circuit is cleared, and all of the global bit lines are discharged. After that, all of the global bit lines are precharged, a memory cell is discharged (VRW1), the global bit lines are selectively precharged, the sense latch circuit is cleared, sensing operation is performed by the sense latch circuit, and all of the global bit lines are discharged (steps S108 to S117).

(4) In transfer of the lower bit, in a manner similar to the transfer of the upper bit, data held in the sense latch circuit is transferred and stored into the SRAM (lower bit) (step S118).

(5) In the second access process, data stored in the SRAM is output to the outside. At this time, synchronously with a read enable control signal /RE, read data is output (step S119).

Figure 10:
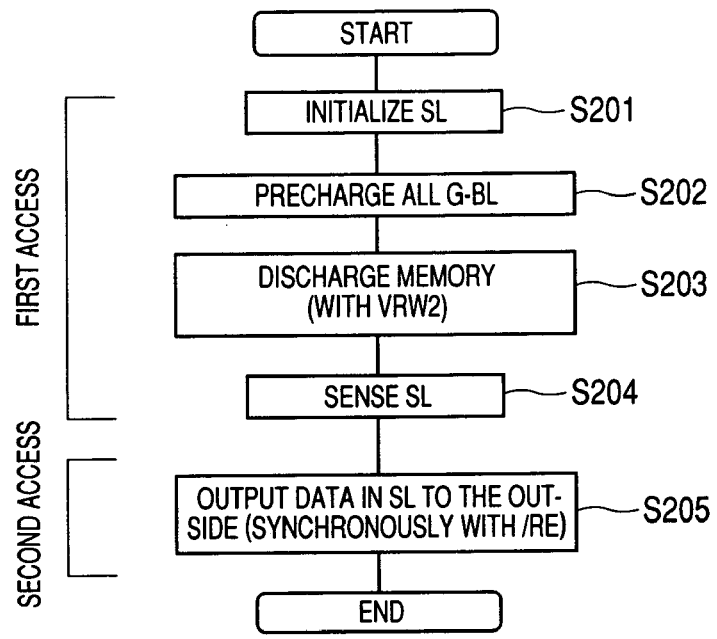
FIG. 10 is a flowchart showing a binary data reading mode.

As shown in FIG. 10, the binary data reading mode includes a first access process and a second access process. In the binary data reading mode, lower four bits are fixed and the upper four bits are output as read data.

(1) In the first access process, the sense latch circuit is initialized, all of global bit lines are precharged and, after that, the read voltage VRW2 is applied to a word line connected to a selected memory cell to discharge the memory cell (steps S201 to S203). Data on the global bit line is sensed and latched by the sense latch circuit (step S204).

(2) In the second access process, the data held in the sense latch circuit is output as read data to the outside synchronously with the read enable control signal /RE (step S205).

An operation of the writing operation in the flash memory of the embodiment will be described with reference to FIGS. 12 to 25. The writing operation has, although not limited, for example, a high-speed wring mode shown in FIGS. 12 to 14, a writing mode with pre-verification shown in FIGS. 15 to 17, a writing mode from the low voltage side shown in FIGS. 18 and 19, and a writing mode employing simple upper end determination shown in FIGS. 20 to 25.

Figure 14:
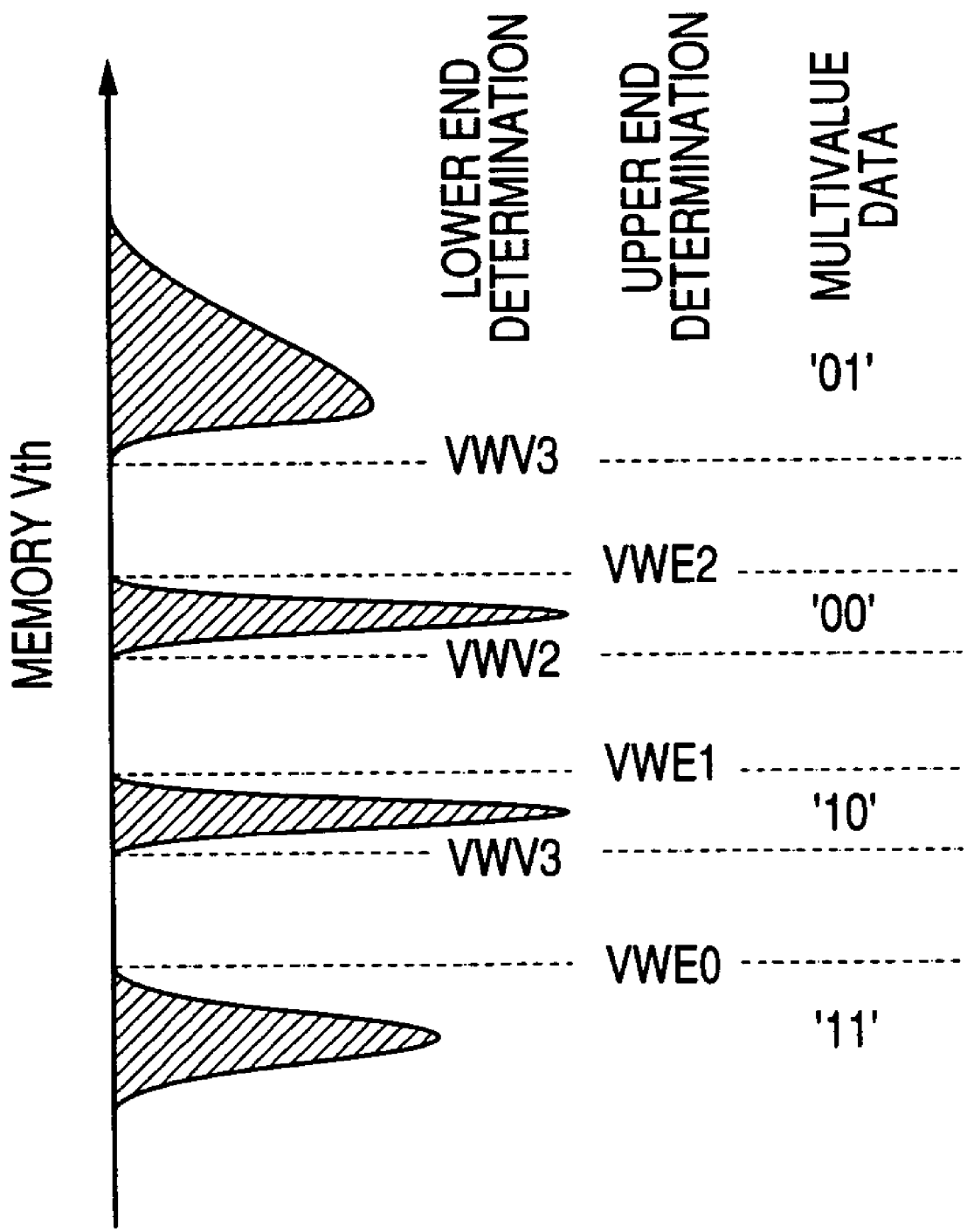
FIG. 14 is a diagram showing the relation between the threshold voltage distribution and the write operation voltage of a memory cell.

In the writing mode, the relations among the threshold voltage distribution (write voltage), an upper end determination voltage, and a lower end determination voltage of a memory cell are as shown in FIG. 14. The upper end determination voltage of the "11" distribution of multivalue data is set as VWE0. The upper and lower end determination voltages of the "10" distribution are set as VWE1 and VWV1, respectively. The upper and lower end determination voltages of the "00" distribution are set as VWE2 and VWV2, respectively. The lower end determination voltage of the "01" distribution is set as VWV3.

In the writing mode, in the above-described "one sense latch circuit+two SRAMs" configuration, the upper and lower bits of write data of two bits are stored in the two SRAMs 51 and 52, respectively. At the time of writing the threshold voltage of each memory cell, data of the SRAMs 51 and 52 is synthesized and the resultant data is transferred to the sense latch circuit 41 (SL). At the time of the transfer, "H" is sent for only a memory cell selected to be written and "L" is sent for the others.

Writing of a threshold voltage distribution of each memory cell includes a "writing process" of repeating "application of a write bias" for applying a write voltage to a word line to increase the threshold voltage of a memory cell selected to be written and "write verification" of determining whether the threshold voltage of the memory cell selected to be written has increased to a desired voltage or not, and an "upper end determining process" of checking whether over-writing occurs or not. At the head of each of the writing process and the upper end determining process, a write data transferring process is performed. The details will be described in order hereinbelow by referring to FIGS. 12 to 25.

Figure 12:
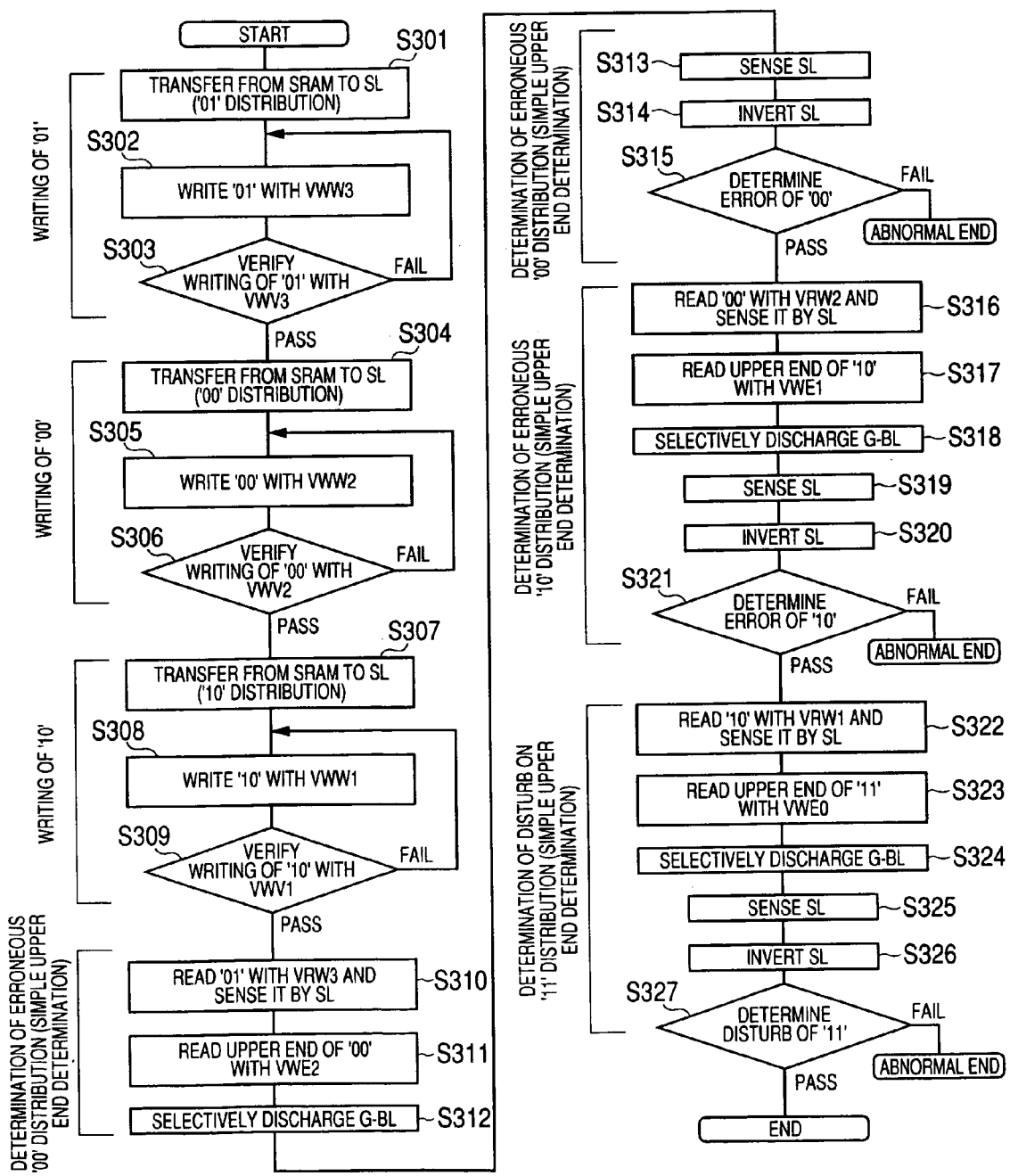
FIG. 12 is a flowchart showing a high-speed writing mode.

As shown in FIG. 12, in the high-speed writing mode, writing of the "01" distribution, writing of the "00" distribution, writing of the "10" distribution, determination of erroneous "00" distribution (simple upper end determination), determination of erroneous "10" distribution (simple upper end determination), and determination of disturb on the "11" distribution (simple upper end determination) are performed in order.

(1) In writing of the "01" distribution, data stored in the SRAM is transferred to the sense latch circuit and held in the sense latch circuit (step S301). At this time, data of the "01" distribution is transferred to the sense latch circuit.

The "01" distribution is written into a memory cell (step S302). At this time, a write voltage VWW3 corresponding to the "01" distribution is applied to the word line connected to the selected memory cell.

Subsequently, the writing of the "01" distribution is verified (step S303). At this time, a write verify voltage VWV3 corresponding to the lower end determination voltage of the "01" distribution is applied to the word line connected to the selected memory cell and whether the voltage is higher than the write verify voltage VWV3 or not is determined. In the write verification of the "01" distribution, when the writing of the "01" distribution passes the verification, the program shifts to the next process. At the time of failure, the writing of the "01" distribution is repeated until the writing passes the verification. In the case where predetermined time has elapsed before the writing passes the verification, all of bits are written and the routine is finished as abnormal end.

Figure 13:
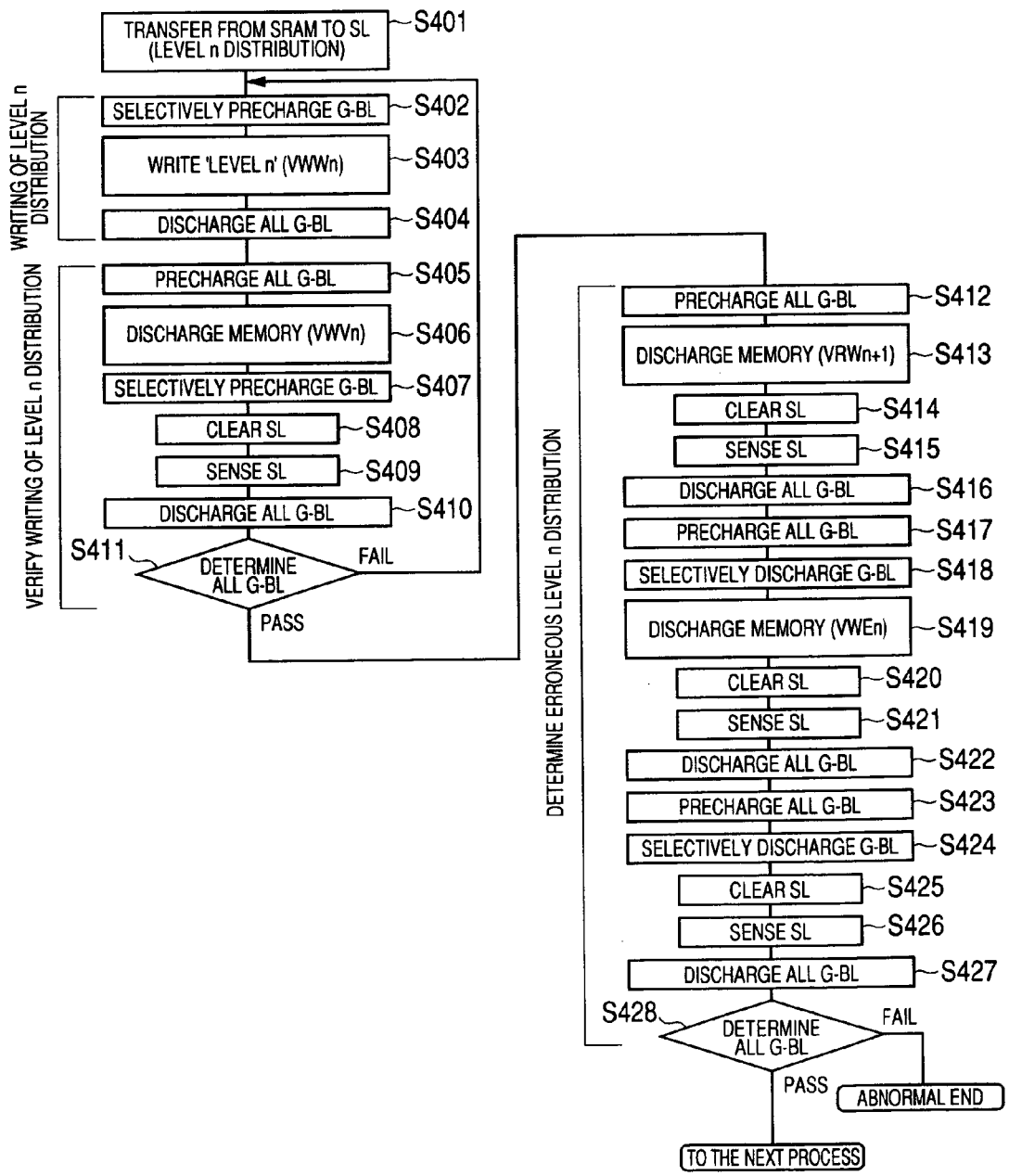
FIG. 13 is a flowchart showing the details of writing, write verification, and error determination.

Specifically, as shown in FIG. 13, at the time of writing a level "n" distribution such as the above-described "01" distribution and the "00" distribution and the "10" distribution which will be described later, data is transferred from the SRAM to the sense latch circuit (step S401), the global bit lines are selectively precharged, a write voltage VWWn corresponding to the level "n" distribution is applied to a word line to write data to a memory cell and, after that, all of the global bit lines are discharged (steps S402 to S404).

In the verification of writing of the level "n" distribution, all of global bit lines are precharged, a write verify voltage VWVn corresponding to the level "n" distribution is applied to the word line to discharge the memory cell and, after that, the global bit lines are selectively precharged (steps S405 to S407). The node of the sense latch circuit is cleared and, after that, data on the global bit line is sensed and latched by the sense latch circuit (steps S408 and S409). After that, all of the global bit lines are discharged and a check is made on all of the global bit lines (steps S410 and S411). At the time of the check, whether all of the global bit lines are, for example, at the "L" level or not is determined. If all of the global bit lines are at the "L" level, the routine shifts to the following process. In the case where there is even one global bit line which is at the "H" level, the processes from writing are repeated.

(2) In writing of the "00" distribution, in a manner similar to the writing of the "01" distribution, transfer of data of the SRAM to the sense latch circuit ("00" distribution), writing (VWW2) of the "00" distribution to a memory cell, and verification (VWV2) of the writing of the "00" distribution are sequentially performed (steps S304 to S306).

(3) In writing of the "10" distribution, in a manner similar to the writing of the "01" distribution, transfer of data of the SRAM to the sense latch circuit ("10" distribution), writing of the "10" distribution to the memory cell (VWW1), and verification (VWV1) of the writing of the "10" distribution are sequentially performed (steps S307 to S309).

(4) Indetermination of the erroneous "00" distribution (simple upper end determination), the "01" distribution is read and the read data is sensed and latched by the sense latch circuit (step S310). At the time of reading the "01" distribution, the read voltage VRW3 is applied to the word line.

After reading the upper end of the "00" distribution, the global bit lines are selectively discharged (steps S311 and S312). At the time of reading the upper end of the "00" distribution, an upper end determination voltage VWE2 is applied to the word line.

After that, data is sensed and latched by the sense latch circuit and is inverted and then whether writing of the "00" distribution is passed or not is determined (steps S313 to S315). If the writing of the "00" distribution passes the check, the routine shifts to the next process. If the writing fails, the threshold voltage distribution is held and the routine is finished as abnormal end.

Specifically, as shown in FIG. 13, in the check (simple upper end determination) to see whether the level "n" distribution such as the above-described "00" distribution and the "10" distribution which will be described later is erroneous or not, all of the global bit lines are precharged and a read voltage VRWn+1 corresponding to a level "n+1" distribution is applied to the word line to discharge the memory cell (steps S412 and S413). The node of the sense latch circuit is cleared, the data on the global bit line is sensed and latched by the sense latch circuit and, after that, all of the global bit lines are discharged (steps S414 to S416). After that, all of the global bit lines are precharged and then selectively discharged. Subsequently, an upper end determination voltage VWEn corresponding to the level "n" distribution is applied to the word line to discharge the memory cell (steps S417 to S419). The node of the sense latch circuit is cleared, the data on the global bit line is sensed and latched by the sense latch circuit and, after that, all of the global bit lines are discharged (steps S420 to S422). Subsequently, all of global bit lines are precharged and then selectively discharged, the node of the sense latch circuit is cleared, and the data on the global bit line is sensed and latched by the sense latch circuit (steps S423 to S426). All of the global bit lines are discharged and a check is made on all of the global bit lines (steps S427 and S428).

(5) Indetermination of the erroneous "10" distribution (simple upper end determination), in a manner similar to the determination of the erroneous "00" distribution (simple upper end determination), reading of the "00" distribution (VRW2), sensing operation by the sense latch circuit, reading of the upper end of the "10" distribution (VWE1), selective discharging of the global bit lines, sensing operation by the sense latch circuit, inversion of data, and determination of the erroneous "11" distribution are sequentially performed (steps S316 to S321).

(6) In the disturb determination of the "11" distribution (simple upper end determination), in a manner similar to the determination of the erroneous "00" distribution (simple upper end determination), reading of the "10" distribution (VRW1), sensing operation by the sense latch circuit, reading of the upper end of the "11" distribution (VWE0), selective discharge of the global bit lines, sensing operation by the sense latch circuit, and inversion of data are sequentially performed, thereby determining whether the "11" distribution is disturbed or not (steps S322 to S327). In determination of whether the "11" distribution is disturbed or not (simple upper end determination), word disturbance is determined for a not-selected sector side.

Figure 15:
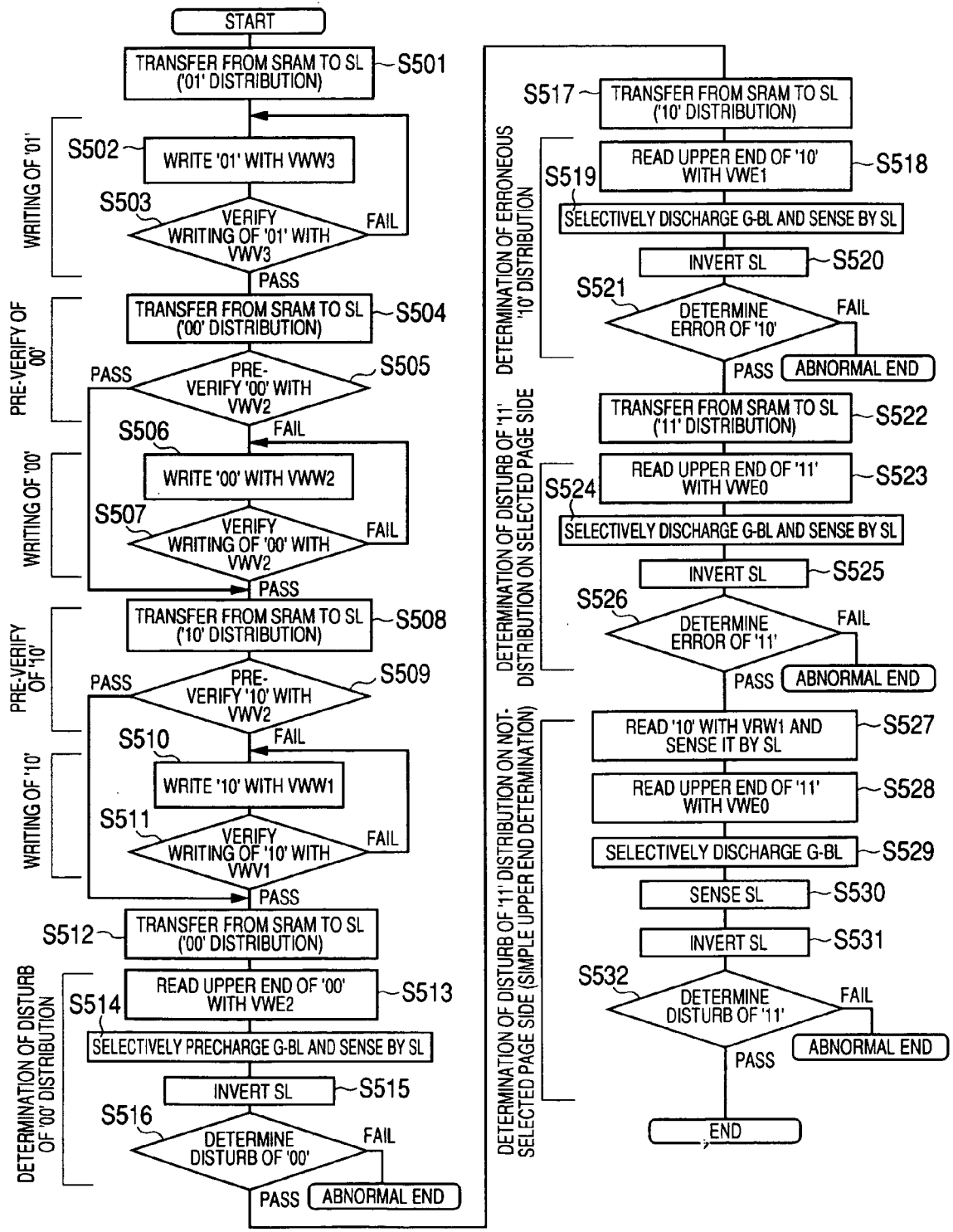
FIG. 15 is a flowchart showing a writing mode with pre-verification.

As shown in FIG. 15, in the writing mode with pre-verification, transfer of data ("01" distribution) from the SRAM to the sense latch circuit, writing of the "01" distribution, pre-verification of the "00" distribution, writing of the "00" distribution, pre-verification of the "10" distribution, and writing of the "10" distribution are sequentially performed. Transfer of data ("00" distribution) from the SRAM to the sense latch circuit, determination of whether the "00" distribution is disturbed or not, transfer of data ("10" distribution) from the SRAM to the sense latch circuit, and determination of whether the "10" distribution is erroneous or not are performed. After that, transfer of the data ("11" distribution) from the SRAM to the sense latch circuit, determination of whether the "11" distribution on the selected page side is disturbed or not, and determination of whether the "11" distribution on the not-selected page is disturbed or not (simple upper end determination) are sequentially performed.

(1) Since the data transfers from the SRAM to the sense latch circuit (the "01" distribution (step S501), the "00" distribution (step S512), the "10" distribution (step S517), and the "11" distribution (step S522)) and writing of the "01" distribution (steps S502 and S503) the "00" distribution (steps S506 and S507), and the "10" distribution (steps S510 and S511) are performed in a manner similar to the high-speed writing mode, their description will not be repeated.

(2) In pre-verification of the "00" distribution, data of the "00" distribution stored in the SRAM is transferred to the sense latch circuit and latched. After that, the lower end determination voltage VWV2 corresponding to the "00" distribution is applied to the word line and the "00" distribution is pre-verified (steps S504 and S505). The pre-verification is a process for masking data of the memory cell from write data in order to prevent over-writing. At the time of writing of the "01" distribution in which there is no problem even over-writing is performed, the pre-verification is not executed.

Figure 16:
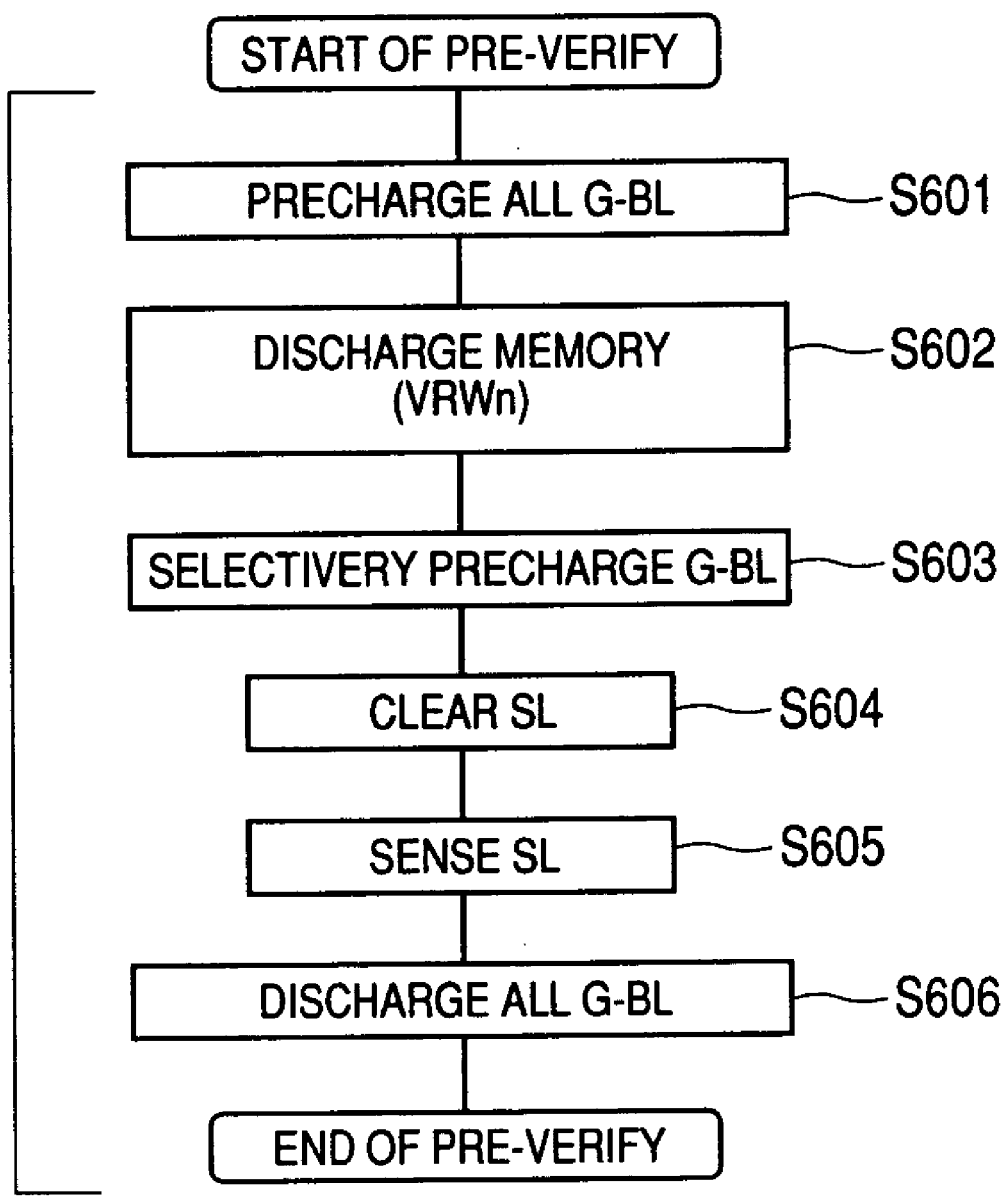
FIG. 16 is a flowchart showing the details of pre-verification.

Specifically, as shown in FIG. 16, in pre-verification of the level "n" distribution such as the above-described "00" distribution and the "10" distribution which will be described later, all of the global bit lines are precharged and the read voltage VRWn corresponding to the level "n" distribution is applied to the word line to discharge the memory cell (steps S601 and S602). The global bit lines are selectively precharged, the node of the sense latch circuit is cleared, and data on the global bit line is sensed and latched by the sense latch circuit (steps S603 to S605). After that, all of the global bit lines are discharged (step S606).

Also in pre-verification of the "10" distribution, in a manner similar to the pre-verification of the "00" distribution, the lower end determination voltage VWV1 corresponding to the "10" distribution is applied to the word line to pre-verify the "10" distribution (steps S508 and S509).

(3) In the determination of whether the "00" distribution is disturbed or not, reading of the upper end of the "00" distribution (VWE2), selective discharge of the global bit lines, the sensing operation by the sense latch circuit, and inversion of data are sequentially performed and whether the "00" distribution is disturbed or not is determined (steps S513 to S516)

(4) In the determination of whether the "10" distribution is erroneous or not, reading of the upper end of the "10" distribution (VWE1), selective discharge of the global bit lines, sensing operation by the sense latch circuit, and inversion of data are sequentially performed, and whether the "10" distribution is erroneous or not is determined (steps S518 to S521).

(5) In the determination of whether the "11" distribution on a selected page side is disturbed or not, reading of the upper end of the "11" distribution (VWE0) selective discharge of the global bit lines, sensing operation by the sense latch circuit, and inversion of data are sequentially performed, and whether the "11" distribution is disturbed or not is determined (steps S523 to S526).

Figure 17:
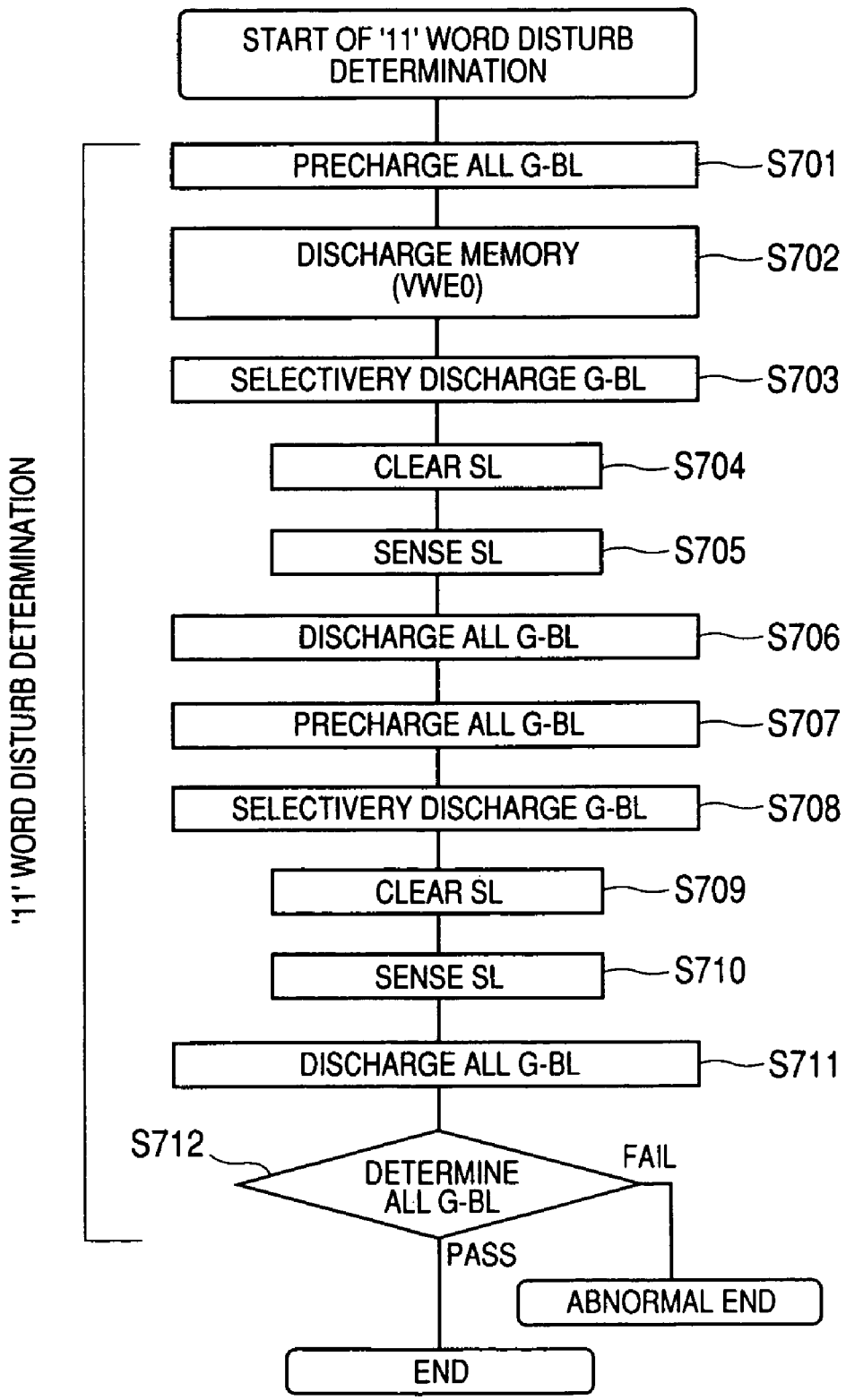
FIG. 17 is a flowchart showing the details of disturb determination.

Specifically, as shown in FIG. 17, in the determination of whether the "11" distribution on the selected page side is disturbed or not, all of the global bit lines are precharged, the upper end determination voltage VWE0 corresponding to the "11" distribution is applied to the word line, and the memory cell is discharged (steps S701 and S702). The global bit lines are selectively discharged, the node of the sense latch circuit is cleared, data on the global bit line is sensed and latched by the sense latch circuit and, after that, all of the global bit lines are discharged (steps S703 to S706). After that, all of the global bit lines are precharged and then selectively discharged, the node of the sense latch circuit is cleared, and data on the global bit line is sensed and latched by the sense latch circuit (steps S707 to S710). All of the global bit lines are discharged and a check is made to see if all of the global bit lines are discharged (steps S711 and S712).

(6) In determination of whether the "11" distribution on the not-selected page side is disturbed or not (simple upper end determination), reading of the "10" distribution (VRW1), sensing operation by the sense latch circuit, reading of the upper end of the "11" distribution (VWE0), selective discharge of the global bit lines, sensing operation by the sense latch circuit, and inversion of data are sequentially performed, and whether the "11" distribution is disturbed or not is determined (steps S527 to S532).

Figure 18:
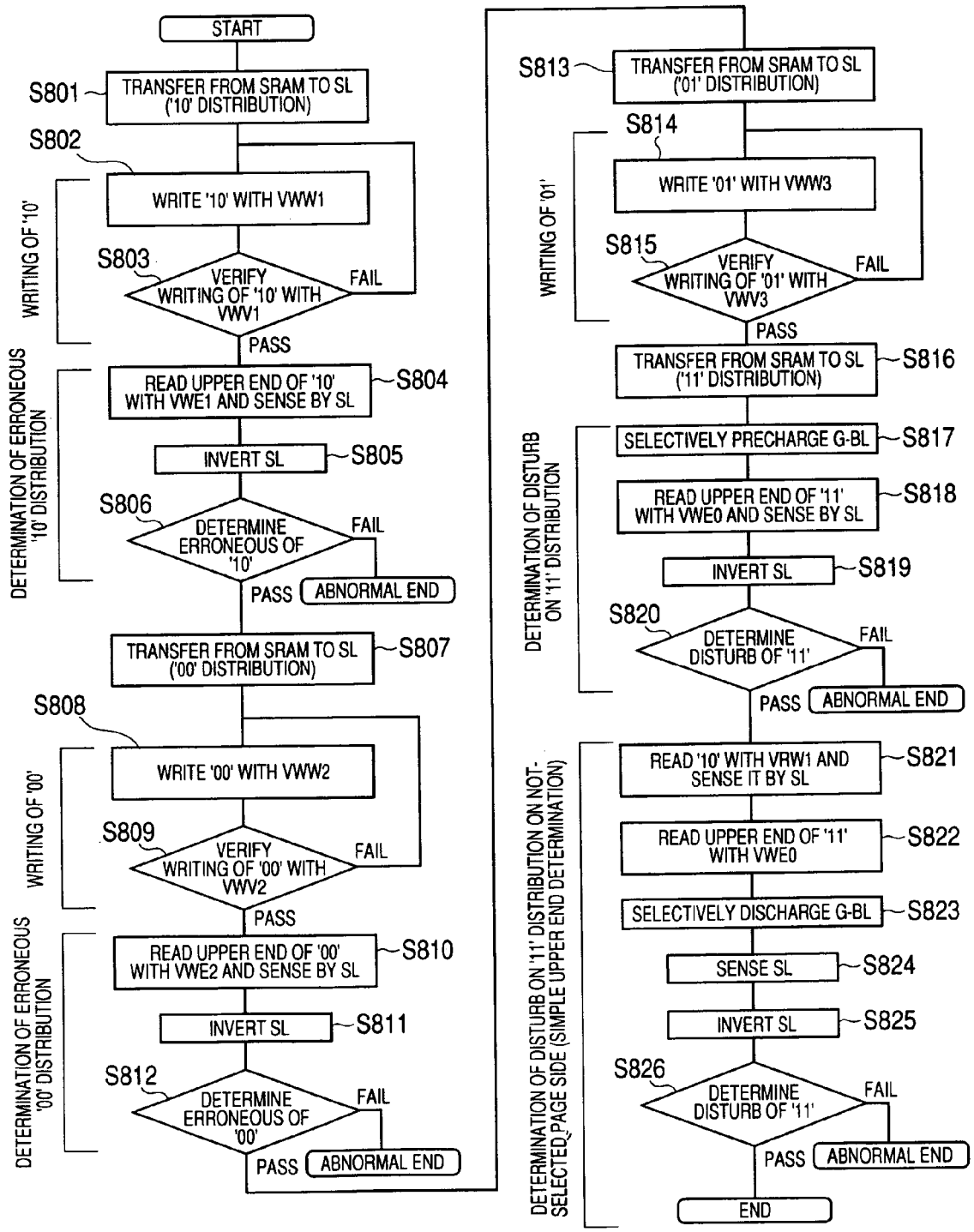
FIG. 18 is a flowchart showing a writing mode from a low voltage side.

As shown in FIG. 18, in the writing mode from the low voltage side, transfer of data ("10" distribution) from the SRAM to the sense latch circuit, writing of the "10" distribution, determination of whether the "10" distribution is erroneous or not, transfer of data ("00" distribution) from the SRAM to the sense latch circuit, writing of the "00" distribution, determination of whether the writing of the "00" distribution is erroneous or not, transfer of data ("01" distribution) from the SRAM to the sense latch circuit, writing of the "01" distribution, transfer of data ("11" distribution) from the SRAM to the sense latch circuit, determination of whether the "11" distribution is disturbed or not, and determination of whether the "11" distribution on the not-selected page side is disturbed or not (simple upper end determination) are sequentially performed.

In the mode of writing from the low-voltage side, the data transfers from the SRAM to the sense latch circuit (the "10" distribution (step S801), the "00" distribution (step S807), the "01" distribution (step S813), and the "11" distribution (step S816)), writing of the "10" distribution (steps S802 and S803), the "00" distribution (steps S808 and S809), and the "01" distribution (steps S814 and S815), determination of the erroneous "10" distribution (steps S804 to S806) and the erroneous "00" distribution (steps S810 to S812), determination of disturbance on the "11" distribution (steps S817 to S820), and determination of disturbance of the "11" distribution on the not-selected page side (simple upper end determination (steps S821 to S826) are performed in a manner similar to the writing mode, so that their detailed description will not be repeated.

The mode of writing from the low voltage side is particularly characterized by (1) writing from the low voltage side of the threshold voltage distribution of the multivalue memory and (2) continuous execution of the "writing process" and the "upper end determining process" every threshold voltage distribution of the memory cell. Consequently, after completion of the process of writing the "10" distribution and the "00" distribution, the threshold voltages of all of the memory cells are lower that the upper end determination voltages of the "10" and "00" distributions. Therefore, in the process of determining the upper ends of the "10" and "00" distributions, a process of masking the other threshold voltage distributions is not performed, so that transfer of write data is unnecessary.

Figure 19:
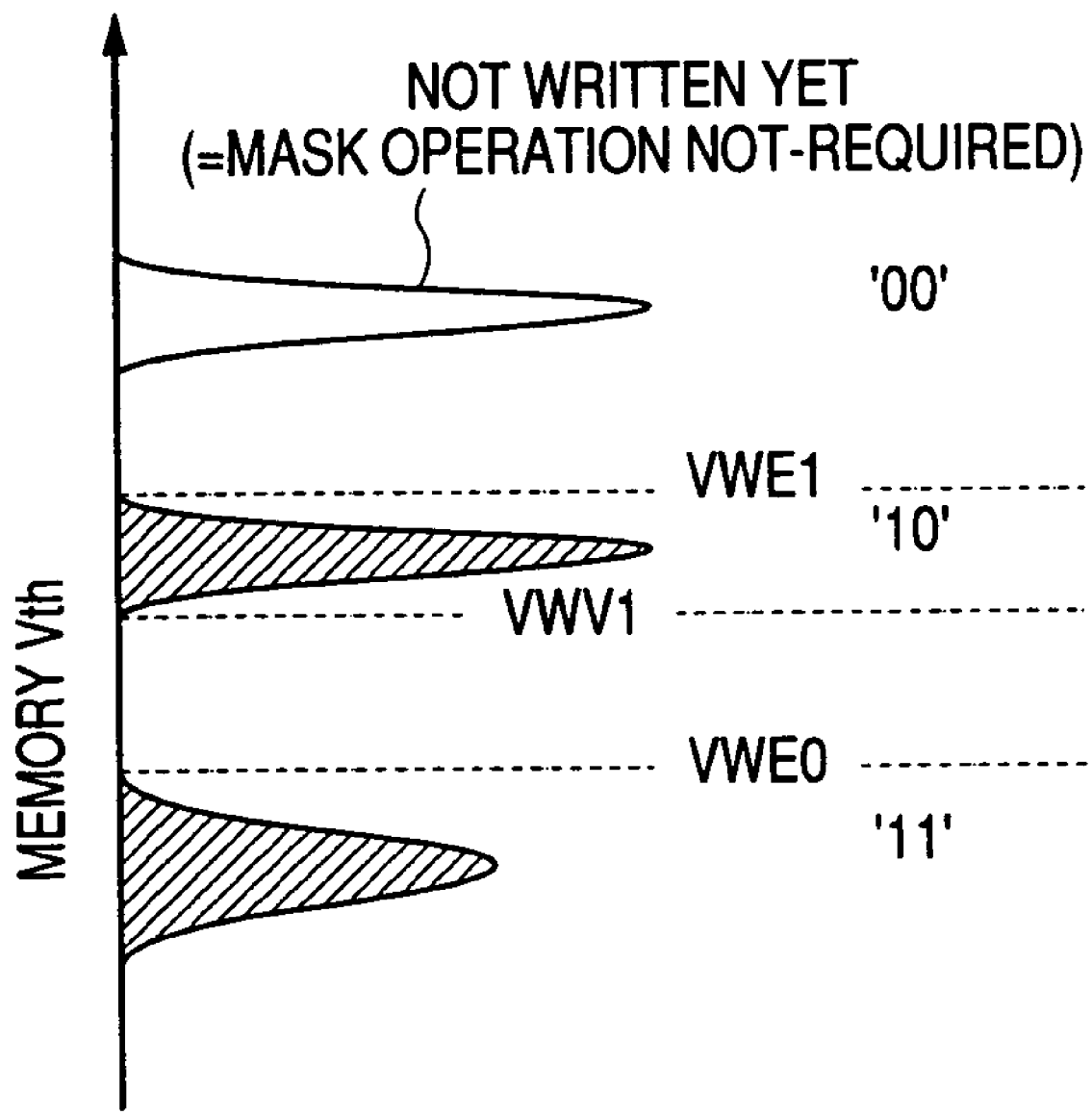
FIG. 19 is a diagram showing a threshold voltage distribution of a memory cell immediately after completion of the writing process.

For example, as shown in FIG. 19, in the case of performing the writing process of the "10" distribution, the threshold voltage distribution of a memory cell immediately after completion of the writing process of the "10" distribution is on the lower voltage side of the upper end determination voltage VWE1 of the "10" distribution, and the threshold voltage of the "00", distribution is not written yet, so that the masking operation is unnecessary.

Figure 20:
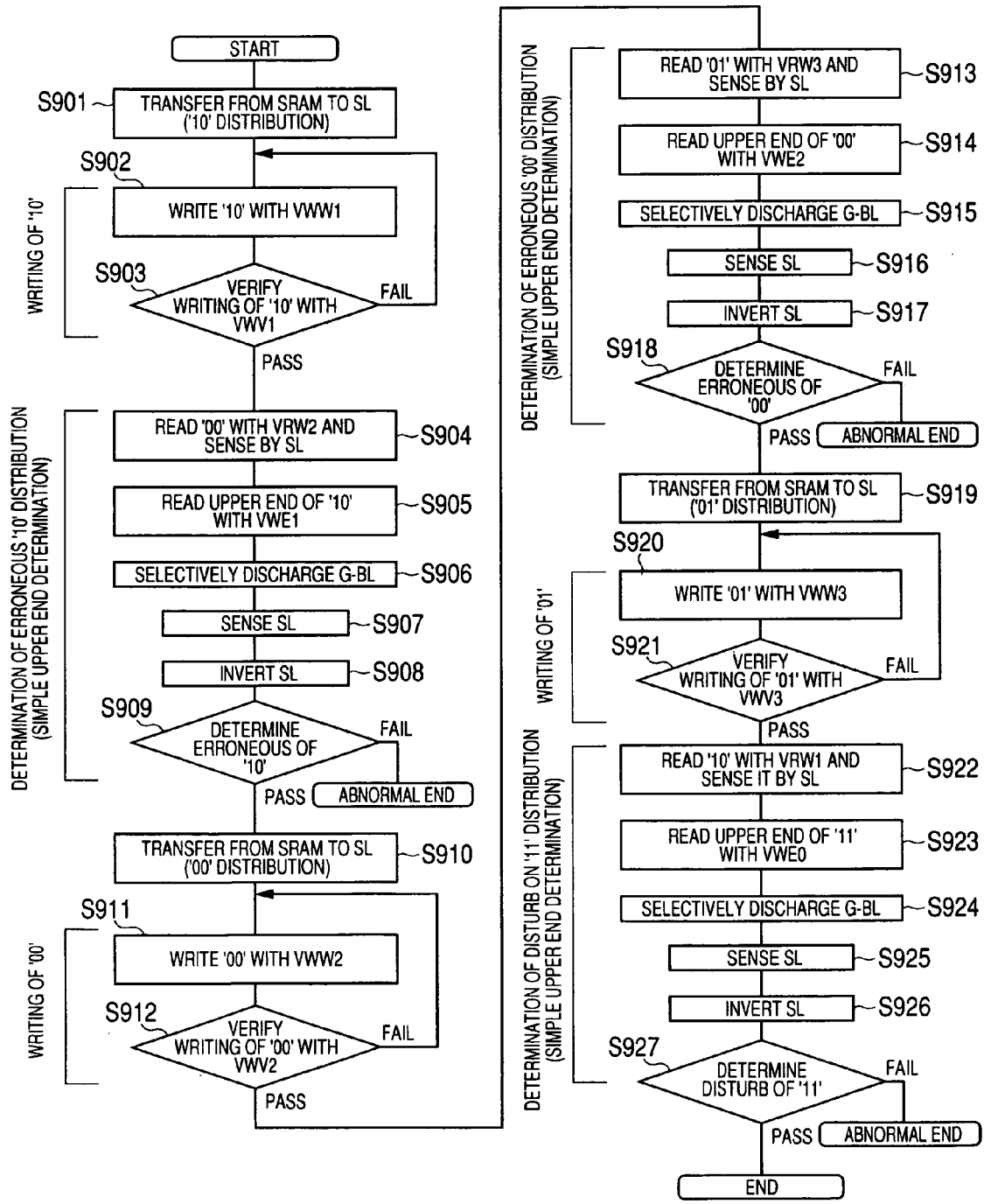
FIG. 20 is a flowchart showing a writing mode employing simple upper end determination.

In the write mode employing the simple upper end determination as shown in FIG. 20, transfer of data ("10" distribution) from the SRAM to the sense latch circuit, writing of the "10" distribution, determination the erroneous "10" distribution (simple upper end determination), transfer of data ("00" distribution) from the SRAM to the sense latch circuit, writing of the "00" distribution, determination of the erroneous "00" distribution (simple upper end determination), transfer of data ("01" distribution) from the SRAM to the sense latch circuit, and determination of whether the "11" distribution is disturbed or not (simple upper end determination) are sequentially performed. In the determination of whether the "11" distribution is disturbed or not, word disturb determination on the not-selected sector side is performed.

In the writing mode employing the simple upper end determination, the data transfers from the SRAM to the sense latch circuit (the "10" distribution (step S901), the "00" distribution (step S910), and the "01" distribution (step S919)), writing of the "10" distribution (steps S902 and S903), the "00" distribution (steps S911 and S912), and the "01" distribution (steps S920 and S921), determination of the erroneous "10" distribution (steps S904 to S909) and the "00" distribution (steps S913 to S918), and determination of disturbance on the "11" distribution (simple upper end determination) (steps S922 to S927) are performed in a manner similar to the writing mode, so that their detailed description will not be repeated.

In the writing mode employing the simple upper end determination, a memory cell to be subjected to upper end determination is determined on the basis of data stored in the memory cell. Therefore, write data on the SRAM is not used, so that transfer of write data becomes unnecessary at the time of the upper end determining process of the "11", "10", and "00" distributions (particularly, the "11" distribution is called an erase distribution).

Figure 21:
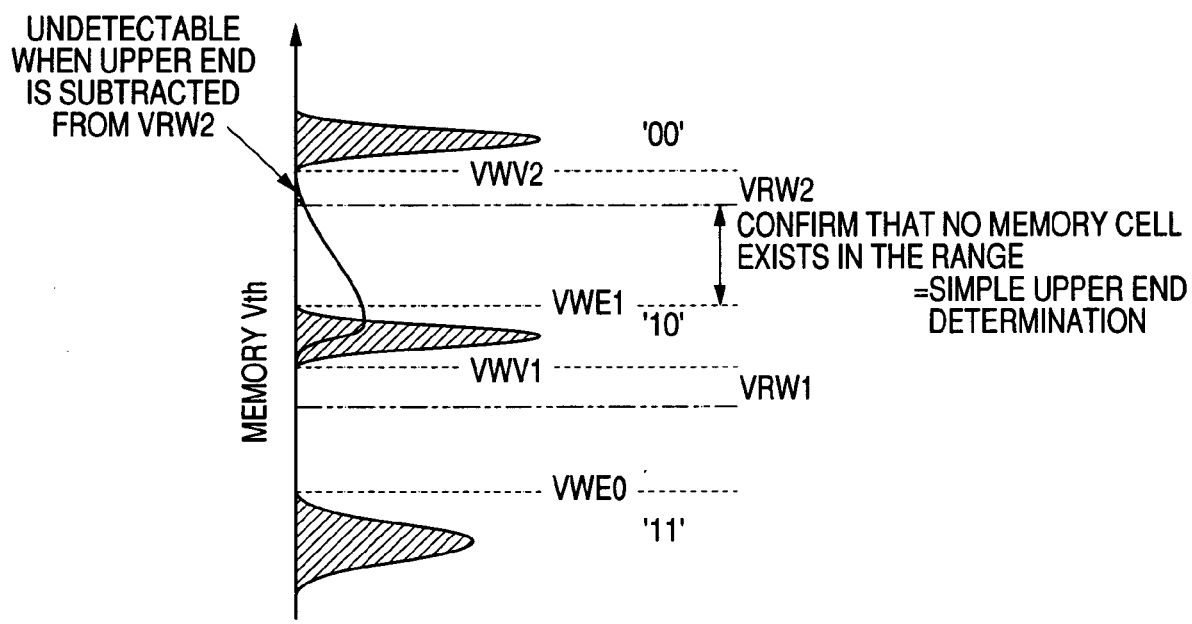
FIG. 21 is a diagram showing the simple upper end determination and a memory cell threshold voltage distribution.

For example, as shown in FIG. 21, in the case of performing the simple upper end determination of the "10" distribution, it is confirmed that no memory cell having the threshold voltage in a range from the "read voltage VRW2 of the "00" distribution (the threshold voltage distribution higher than the "10" distribution)" to the "upper end determination voltage VWE1 of the "10" distribution" exists. Generally, in the simple upper end determining process of the level "n" distribution, it is confirmed that no memory cell having the threshold voltage in a range from the "read voltage of the level "n+1" distribution" to the "upper end determination voltage of the level "n" distribution" exists.

In the writing mode employing the simple upper end determination, it is unnecessary to continuously execute the "writing process" and the "upper end determining process" for each threshold voltage of the memory cell. Further, the upper end of the erase distribution is determined after completion of the writing process on all of the distributions for the write disturb determination.

Therefore, in the writing mode employing the simple upper end determination, transfer of write data is unnecessary, so that writing can be executed at higher speed. On the other hand, the writing mode has a drawback such that even when the threshold voltage of the memory cell which is inherently to be in the level "n" distribution is higher than the read voltage of the level "n+1" distribution, it cannot be detected. Even when both of the writing mode and the writing mode from the low voltage side are used, the number of transferring times of write data is not further reduced.

As described above, by introducing the simple upper end determining method into the writing mode, additional writing can be realized in the "one sense latch circuit+two SRAMs" configuration. The additional writing is operation of rewriting a memory cell on a word line, to which writing has been already performed, without performing erasing. The upper end determining process has to be performed on condition that write data on the SRAM corresponds to the written data on the memory cell in a one-to-one manner. In the additional writing, however, write data on the SRAM and the written data on the memory cell do not correspond to each other in a one-to-one manner. Consequently, if the upper end determining process is performed based on the write data on the SRAM, it is not performed successfully.

In contrast, in the simple upper end determining process, write data is not used. Based on data stored in the memory cell, the memory cell to be subjected to upper end determination is determined. Therefore, unlike the additional writing, the upper end determining process can be carried out even if write data on the SRAM does not correspond to the written data on the memory cell in a one-to-one manner.

Figure 22:
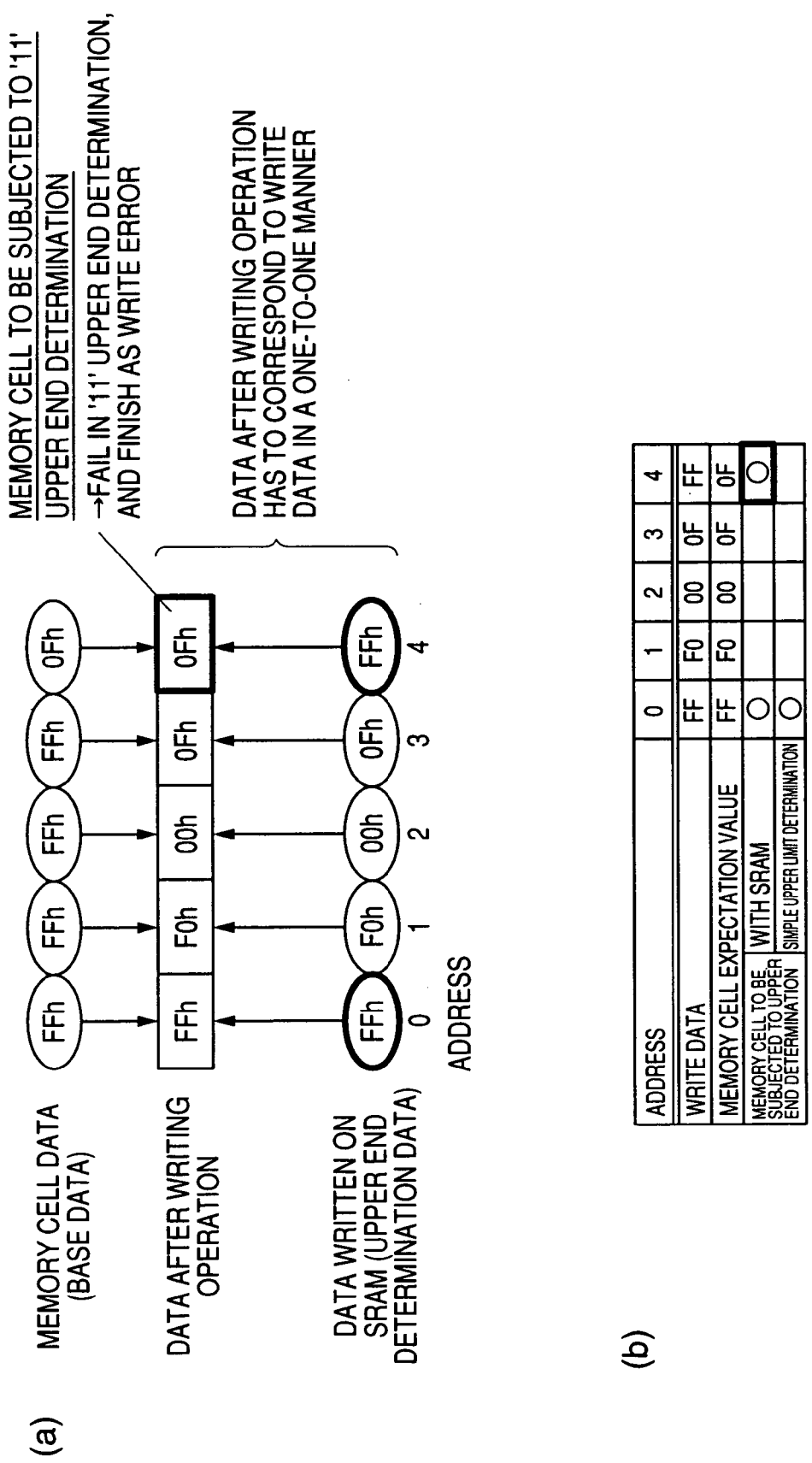
FIGS. 22A and 22B are diagrams showing upper end determination at the time of additional writing.
Figure 23:
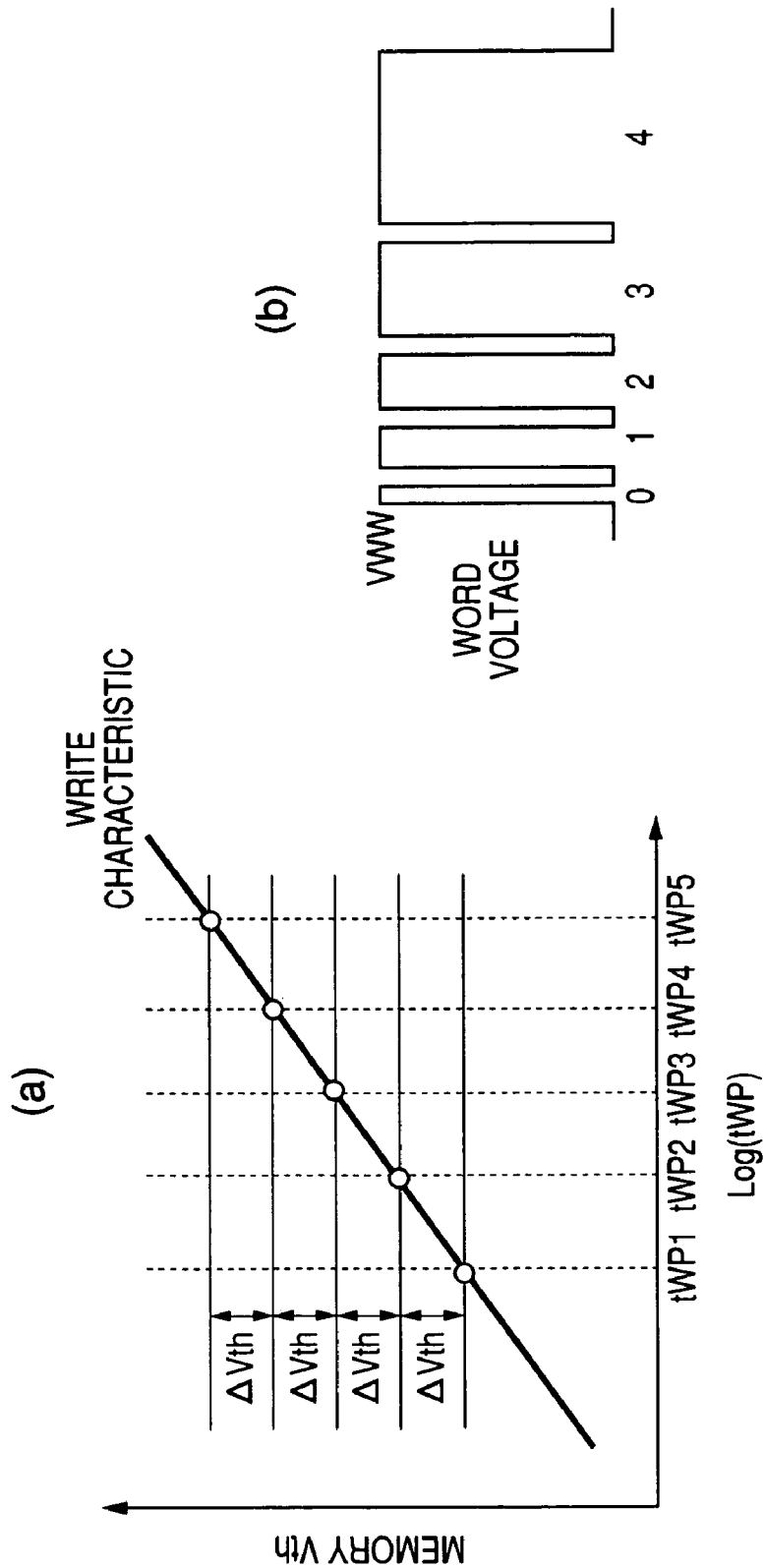
FIGS. 23A and 23B are diagrams showing write characteristics and a power pulse method.
Figure 24:
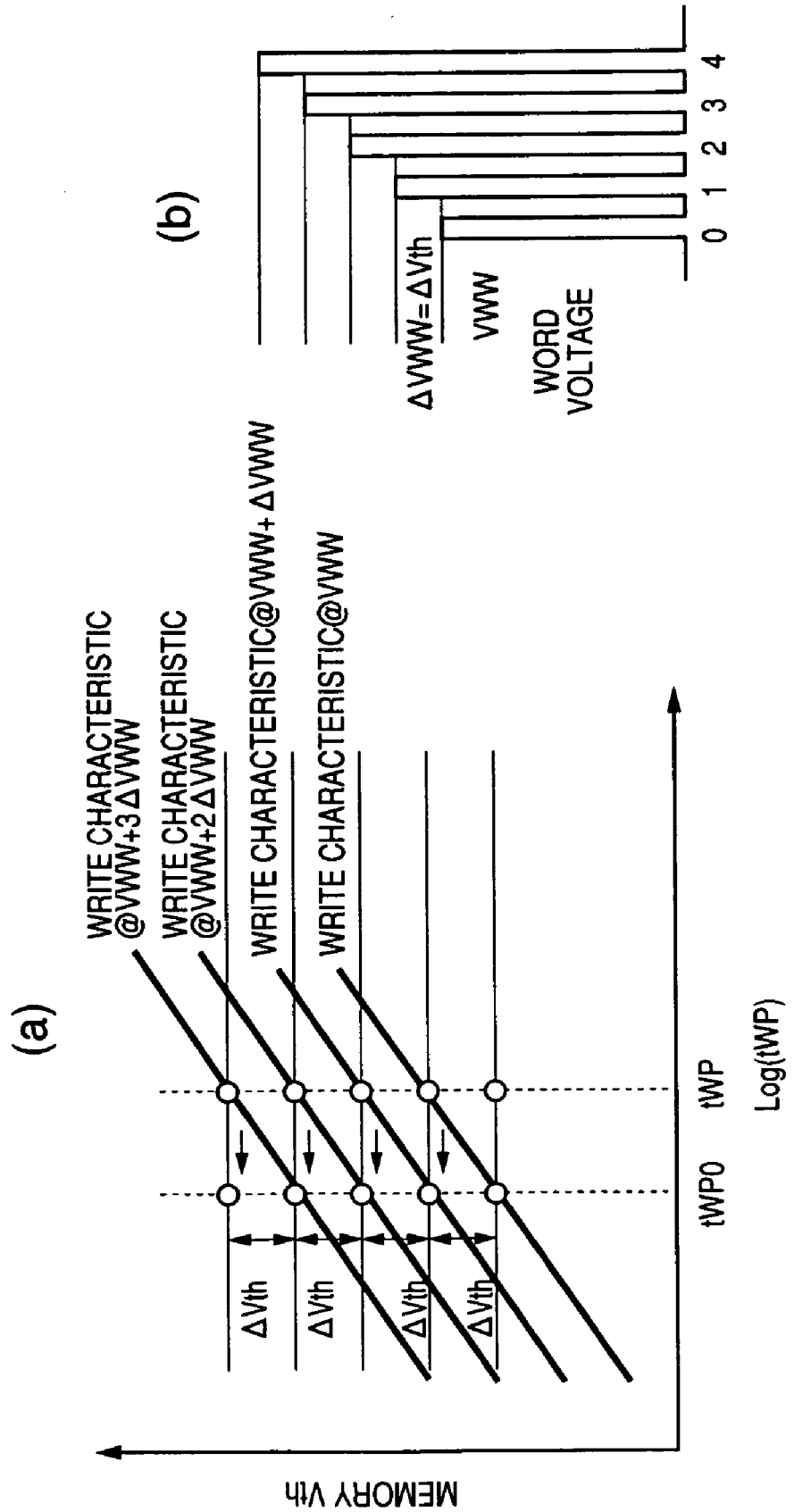
FIGS. 24A and 24B are diagrams showing an ISPP method.

For example, in the case of determining the upper end of the "11" distribution on the basis of write data on the SRAM as shown in FIG. 22, in addresses 0 to 4, write data is FF, F0, 00, 0F, and FF and expectation values of the memory cells are FF, F0, 00, 0F, and 0F. Objects to be subjected to upper end determination are the addresses 0 and 4 in the case of using an SRAM and the address 0 in the case of the simple upper end determination. The upper end determination fails in the address 4 and a write error occurs.

It is known that, in the writing mode, the write characteristic of a flash memory at the time of applying an arbitrary write voltage (VWW) is that the threshold voltage (Vth) of a memory cell is linear with respect to a logarithm (Log) of cumulative write bias application time (write pulse length tWP). Therefore, when the write pulse length is fixed, an increase amount ΔVth of the threshold voltage of a memory cell per application of a write pulse gradually decreases and it causes a problem such that the number of write verifying times increases. To make ΔVth constant and optimize the number of write verifying times, for example, as shown in FIG. 23B, a "power pulse method (in which the bias is fixed and the pulse length is increased at a power ratio)" of increasing write bias application time to the power of the cumulative bias application time every write pulse is employed. The write voltage (VWW) is constant every write pulse.

In the power pulse method, the number of verification times can be optimized but the pulse length (tWP) increases every write pulse, and it causes a problem that the write bias application time (ΣtWP) increases exponentially. It is therefore preferable to employ an "ISPP (Incremental Step Pulse Programming) method (in which the bias is increased only by ΔVWW every pulse and the pulse length is fixed)" which will be described below.

In contrast to the power pulse method in which the write voltage (VWW) is constant every write pulse, the ISPP method is a method in which the pulse length (tWP) is fixed every write pulse. In the ISPP method, for example, as shown in FIGS. 24A and 24B, the write bias is increased only by ΔVth every pulse (VWWn+1=VWWn+ΔVth) and the write pulse length is kept constant. Consequently, the threshold voltage of the memory cell rises only by ΔVth every pulse application, so that the number of verifying times can be optimized like the power pulse method.

The ISPP method has a problem that the write voltage (VWW) becomes high as the number of write pulse application times increases. However, in a flash memory of 1 Gbit or the like, a channel hot electron injecting method enabling the write voltage VWW to be lower than that in the FN tunneling method is employed, so that there is no operational problem. That is, in the channel hot electron injecting method, a write word voltage can be made lower as compared with that of the FN tunneling method.

Figure 25:
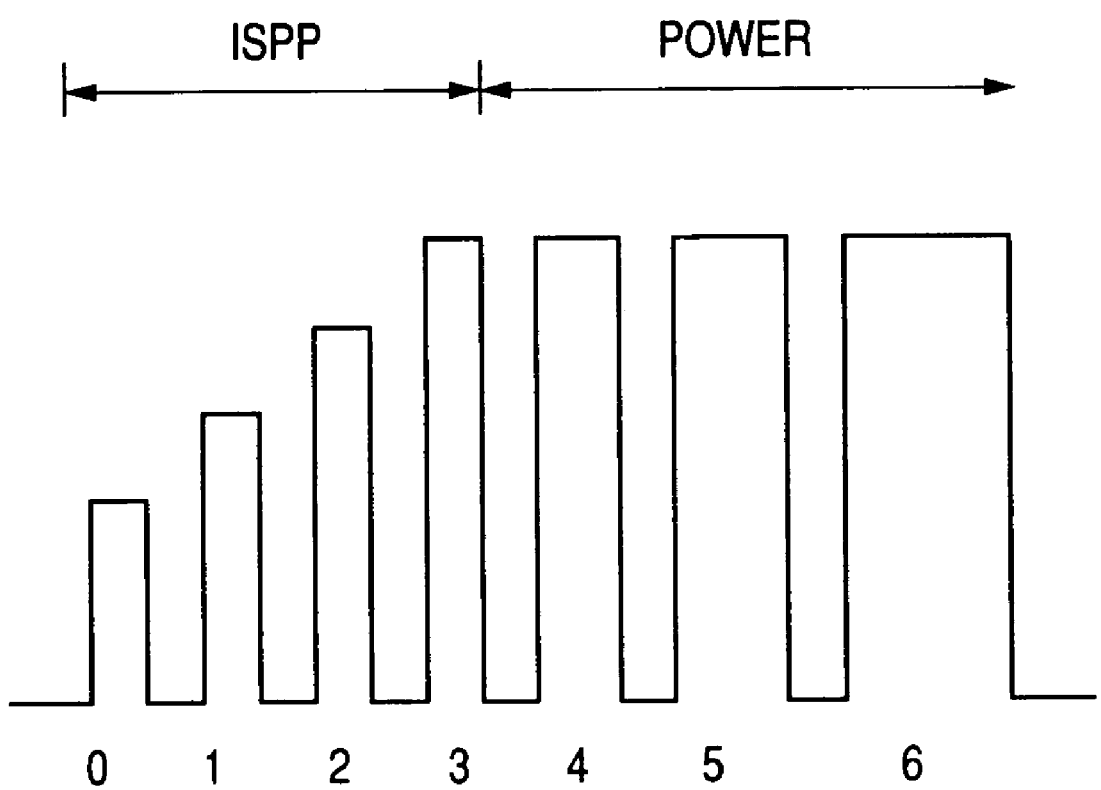
FIG. 25 is a diagram showing a method of combining the power pulse method and the ISPP method.

The method of applying the write bias can be also used by combining the power pulse method and the ISPP method. According to the method, for example, as shown in FIG. 25, the write voltage is increased every write pulse with respect to the write pulses 0 to 3 and the pulse length is increased by the power every write pulse with respect to the write pulses 4 to 6, thereby realizing optimization so as to solve both the problem of increase in the write bias pulse application time and the problem of the high write voltage.

An example of the erasing operation in the flash memory of the embodiment will be described with reference to FIGS. 26 to 31. The erasing operation is performed in, although not limited, for example, the two-page erasing mode shown in FIGS. 26 to 28 and the multi-page erasing mode shown in FIGS. 29 to 31.

Figure 28:
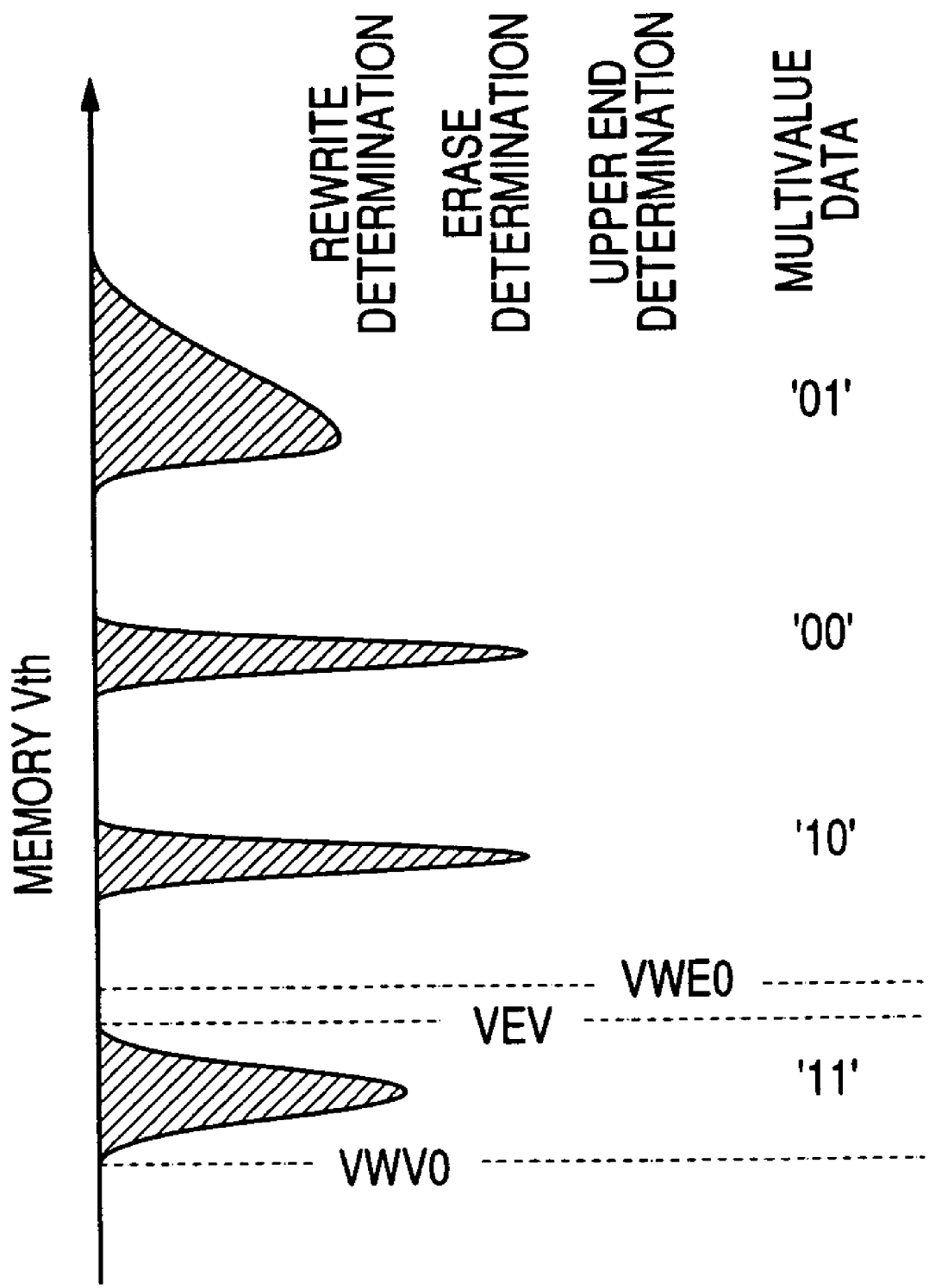
FIG. 28 is a diagram showing the relation between the threshold voltage distribution and the erasing operation voltage of a memory cell.
Figure 29:
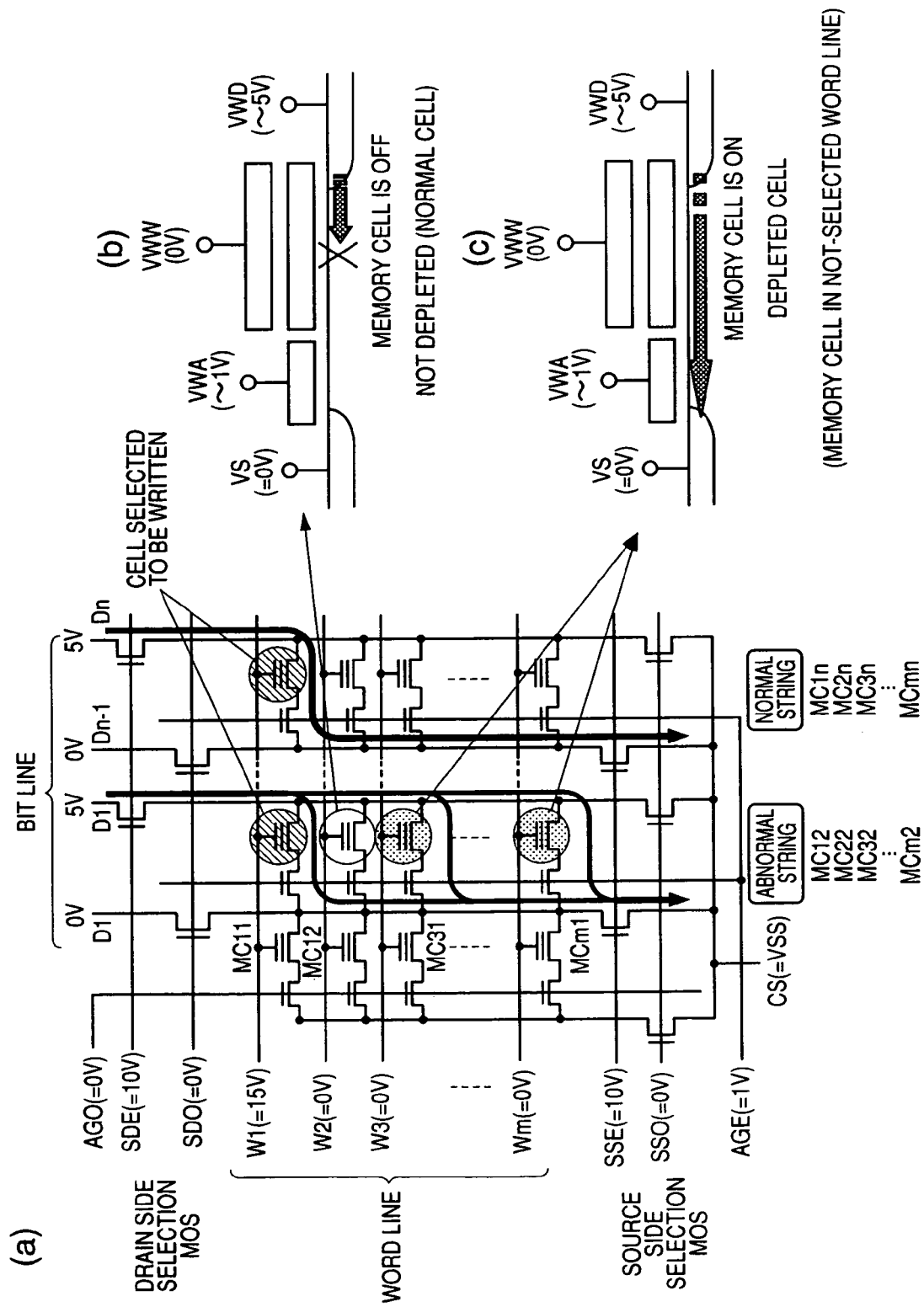
FIGS. 29A to 29C are diagrams showing a rewriting process performed in the case where there is a depleted bit.
Figure 30:
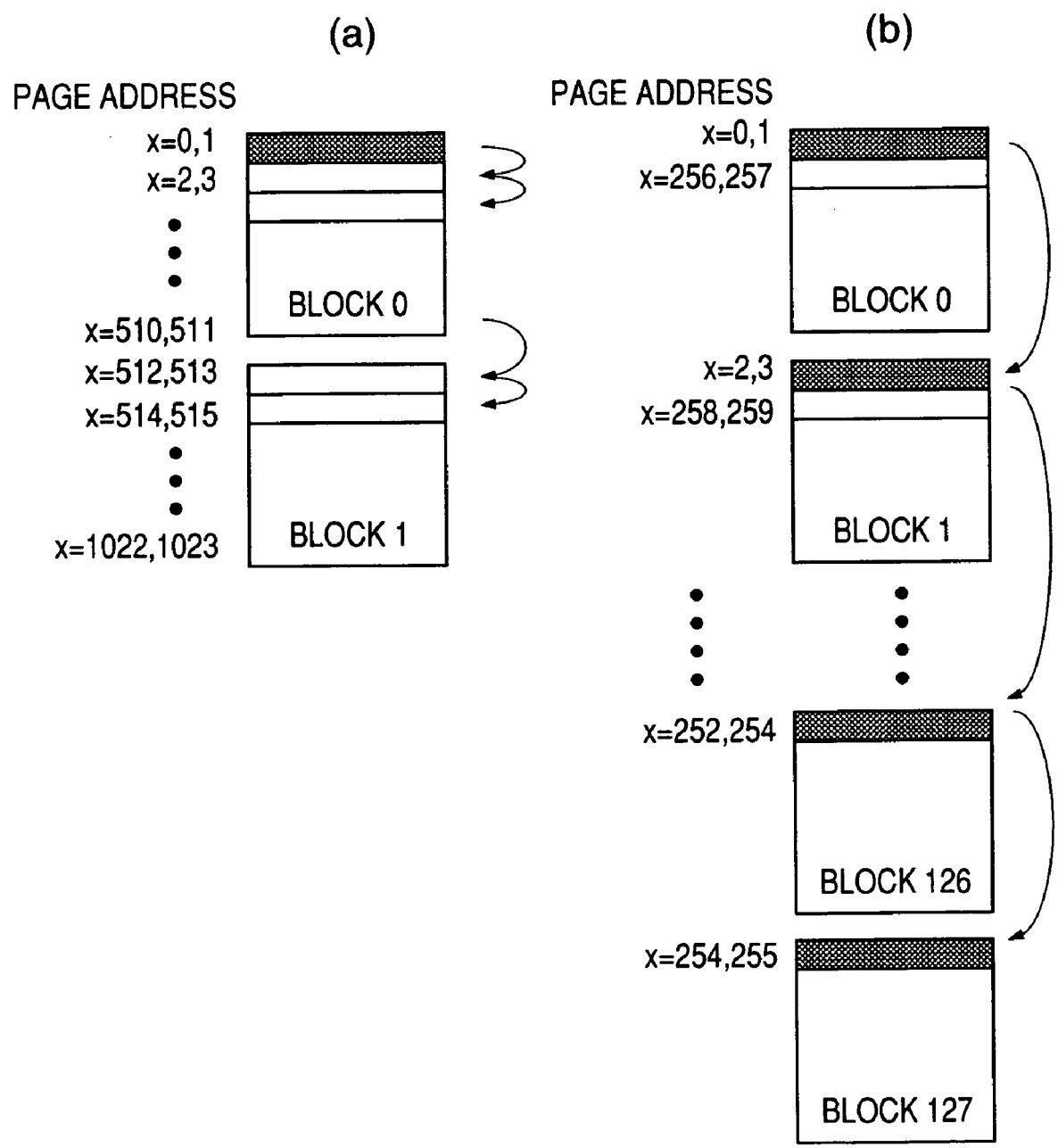
FIGS. 30A and 30B are diagrams showing address scramble capable of erasing multiple pages.

In the erasing mode, the relations between the threshold voltage distribution (erase voltage) of a memory cell and the upper end determination voltage, erase determination voltage, and rewrite determination voltage are as shown in FIG. 28. In the "11" distribution of multivalue data, the upper end determination voltage is set as VWE0, the erase determination voltage is set as VEV, and the rewriting determination voltage is set as VWV0.

Since no SRAM is used in the erasing mode, the erasing mode can be also applied to, for example, the "one sense latch circuit+two data latch circuits" configuration. The erasing mode includes "erasing process" and "rewriting process". In the erasing process, an erase bias is applied to a page to be erased and erase verification is performed. Until the page to be verified passes the erase verification, the sequence from application of the erase bias to the erase verification is repeatedly executed. In the rewriting process, without clearing information in the memory cell which has failed the rewriting verification, the memory cell which has failed the rewriting verification is automatically set as an object to be rewritten, so that the rewriting process is continuously executed on pages selected to be erased.

The two-page erasing mode as one of the erasing modes relates to an erasing method of erasing a plurality of pages arbitrarily selected in a lump. The method realizes, particularly, (1) suppression of the number of erase verification times to the minimum by performing erase verification only on arbitrary one page in the pages to be erased in consideration of variations in the erasing characteristic, and (2) prevention of erroneous determination of the upper end of erasure since it is unnecessary to set a memory to be rewritten every rewrite verification by continuously executing the rewriting process page by page. The details will be described hereinbelow by referring to FIGS. 26 and 27.

Figure 26:
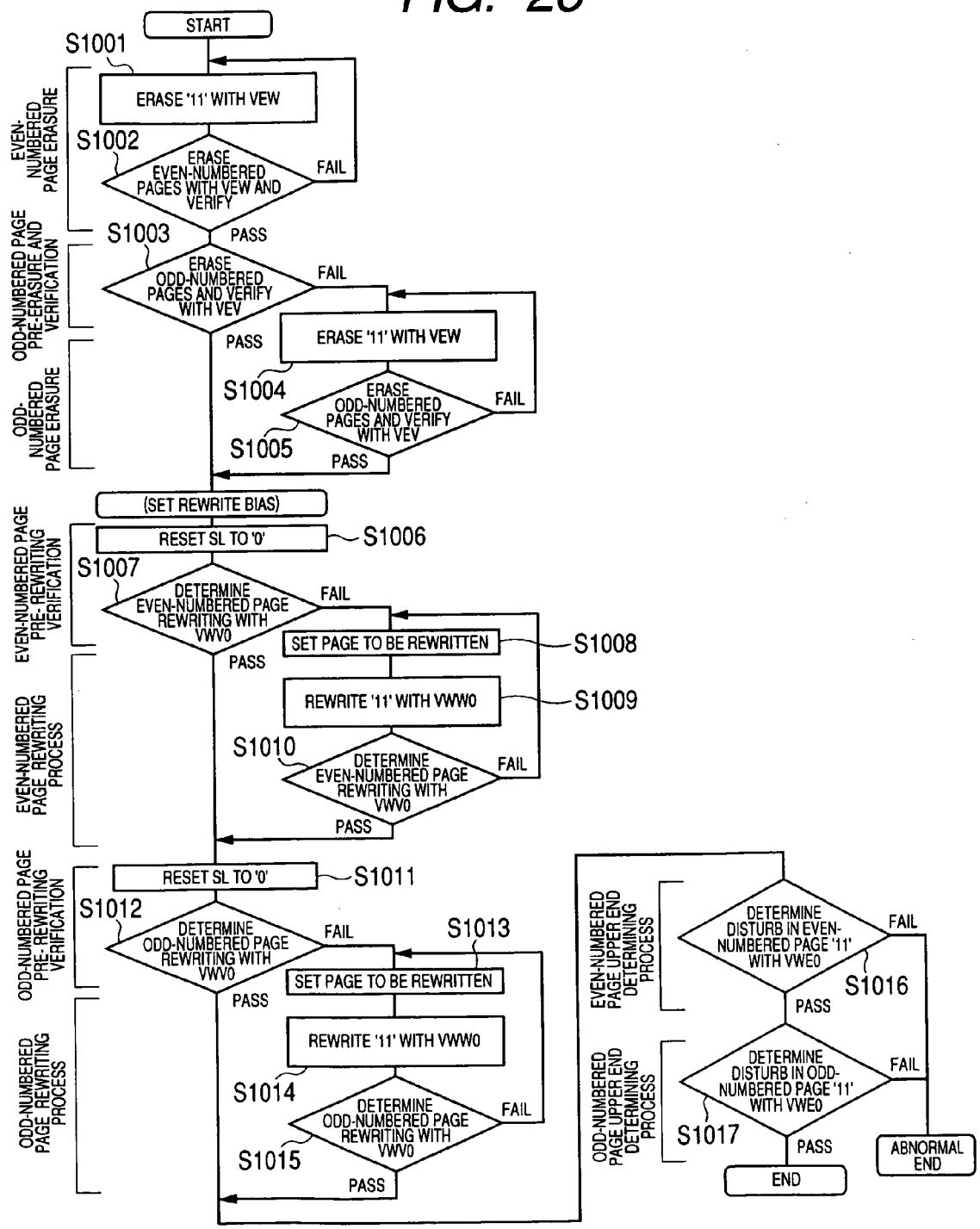
FIG. 26 is a flowchart showing a two-page erasing mode.

As shown in FIG. 26, in the two-page erasing mode, even-numbered page erasure, odd-numbered page pre-erasure and verification, odd-numbered page erasure, even-numbered page pre-rewriting verification, even-numbered page rewriting process, odd-numbered page pre-rewriting verification, odd-numbered page rewriting process, even-numbered page upper end determining process, and odd-numbered page upper end determining process are sequentially performed.

(1) In the even-numbered page erasure, the erase voltage (VEW) is applied to an even-numbered page to be erased and the erasure verification is performed (steps S1001 and S1002). To optimize the number of erase verification times, erasure verification is performed only on arbitrary one even-numbered or odd-numbered page. In the erasure verification, whether the voltage is lower than the erase determination voltage VEW or not is determined. If the page to be verified passes the erasure verification, the routine advances to the next process. If the erasure verification fails, the processes from the application of erase voltage to the erasure verification are repeated until the erasure verification is successfully performed. In the case where predetermined time has elapsed before the page passes the erasure verification, an abnormal flag is set and the routine advances to the next process.

Figure 27:
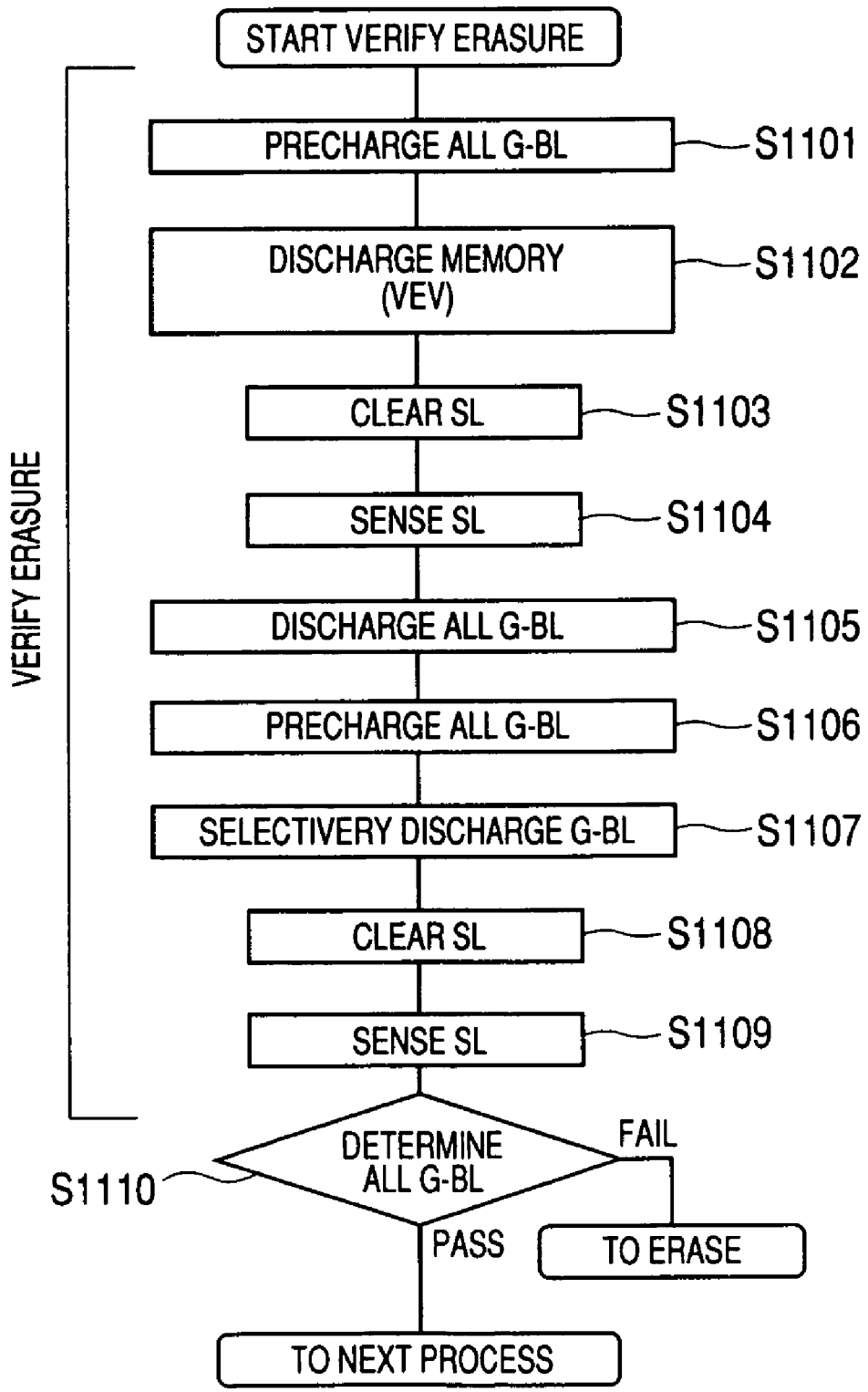
FIG. 27 is a flowchart showing the details of erase verification.

Specifically, as shown in FIG. 27, in the erasure verification of even-numbered pages and odd-numbered pages which will be described later, all of global bit lines are precharged, and the erase determination voltage VEV corresponding to the "11" distribution is applied to a word line to discharge a memory cell (steps S1101 and S1102). The node of the sense latch circuit is cleared, data on the global bit lines is sensed and latched by the sense latch circuit and, after that, all of the global bit lines are discharged (steps S1103 to S1105). After that, all of the global bit lines are precharged and then selectively discharged, the node of the sense latch circuit is cleared, and data on the global bit lines is sensed and latched by the sense latch circuit (steps S1106 to S1109). Finally, all of the global bit lines are subjected to verification (step S1110).

(2) In the odd-numbered page pre-erasure verification, erasure verification is performed on an odd-numbered page (step S1003). At this time, a check is made to see if the voltage is lower than the erasure determination voltage VEV or not. If the page to be verified passes the erasure verification, the routine advances to the rewriting process. In the case of failure, the routine moves to the odd-numbered page erasing process.

(3) In the odd-numbered page erasure, in a manner similar to the even-numbered page erasure, the erase voltage (VEW) is applied to the page to be erased and erasure verification (erase determination voltage VEV) is performed (steps S1004 and S1005). If the page passes the erasure verification, the routine advances to the rewriting process. In the case of failure, the process is repeated until the page passes the erasure verification. In the case where predetermined time has elapsed before the page passes the erasure verification, an abnormal flag is set and the routine advances to the next process. If the even-numbered page erasure verification is executed, the odd-numbered page erasure verification can be omitted in the invention.

(4) In the even-numbered page pre-rewriting verification, for even-numbered pages, the sense latch circuit is reset to "0" and, subsequently, rewriting determination is made (steps S1006 and S1007). In the rewriting determination, whether the voltage is higher than the rewrite determination voltage VWV0 or not is determined. If a page to be pre-rewritten passes the rewrite verification, the routine advances to odd-numbered page pre-rewriting verification. At the time of failure, the routine shifts to the even-numbered page rewriting process.

(5) In the even-numbered page rewriting process, for even-numbered pages, a page to be rewritten is set, a rewrite voltage (VWW0) is applied to the page to be rewritten and, subsequently, rewrite determination is performed (steps S1008 to S1010). In the rewrite determination, whether the voltage is higher than the rewrite determination voltage VWV0 or not is determined. If the page to be rewritten passes the rewrite verification, the routine advances to the odd-numbered page pre-rewrite verification. In the case of failure, until the page passes the odd-numbered page pre-rewriting verification, the processes starting from setting of the page to be rewritten, rewriting, and rewrite verification are repeated. In the case where predetermined time has elapsed before the page passes the verification, the writing process is performed and the routine is finished as abnormal end.

(6) In the odd-numbered page pre-rewriting verification, in a manner similar to the even-numbered page pre-rewriting verification, for odd-numbered pages, the sense latch circuit is reset to "0" and, subsequently, rewriting determination is made (with the rewrite determination voltage VWV0) (steps S1011 and S1012). If a page to be rewritten passes the rewrite determination, the routine advances to even-numbered page upper end determining process. At the time of failure, the routine shifts to the odd-numbered page rewriting process.

(7) In the odd-numbered page rewriting process, in a manner similar to the even-numbered page rewriting process, an odd-numbered page to be rewritten is set, the rewrite voltage (VWW0) is applied to the page to be rewritten and, subsequently, rewrite determination is performed (with rewrite determination voltage VWV0) (steps S1013 to S1015). If the page to be rewritten passes the rewrite determination, the routine advances to the even-numbered page upper-end determining process. In the case of failure, until the page passes the even-numbered page upper-end determining process the processes are repeated. In the case where predetermined time has elapsed before the page passes the determination, the writing process is performed and the routine is finished as abnormal end.

(8) In the even-numbered page upper-end determining process, disturb determination is made with respect to even-numbered pages (step S1016). In the disturb determination, whether the voltage is lower than the upper end determination voltage VWE0 or not is determined. In the case where the page passes the determination, the routine advances to the odd-numbered page upper-end determining process. In the case of failure, the threshold voltage distribution is held and the routine is finished as abnormal end. The rewrite upper end determining process is executed continuously on two pages of an even-numbered page and an odd-numbered page to be described later.

(9) In the odd-numbered page upper-end determining process, in a manner similar to the even-numbered page upper-end determining process, disturb determination (with the upper end determination voltage VWE0) is performed on an odd-numbered page (step S1017). If the page passes the disturb determination, the routine is finished. In the case of failure, the threshold voltage distribution is held and the routine is finished abnormally.

In a multi-page erasing mode, since the hot electron injection writing method is used as the writing principle in the AG-AND type memory array configuration, if a memory cell in an over-erased state is included in a string selected to be rewritten, write current is not sufficiently obtained and the rewriting process cannot be performed. The memory cell in the over-erased state is called a depleted cell (of which threshold voltage is 0V or less). If the over-erased memory cell is connected to a bit line to which the selected memory cell is also connected, a phenomenon occurs such that although the depleted memory cell is not selected, the write current flows.

For example, as shown in FIG. 29A, a problem occurs in the case such that a string made of a memory line of memory cells MC12 to MCm2 becomes abnormal in a block made of memory cells MC11 to MCmn. As shown in FIG. 29A, in the rewriting process, when the memory cells MC12, ..., and MC1n of a memory line of an even-numbered row among the memory cells connected to a word line W1 are selected to be written, 15V is applied to the word line W1 and 5V is applied to each of bit lines D2, ..., and Dn. 0V is applied to the other word lines W2 to Wm and the other bit lines D1, ..., and Dn−1. Simultaneously, 10V is applied to each of the drain-side control signal line SDE and the source-side control signal line SSE of the even-numbered memory rows, 0V is applied to the drain-side control signal line SDO and the source-side control signal line SSO of the odd-numbered memory rows, 1V is applied to the gate control signal line AGE of the even-numbered memory row, and 0V is applied to the gate control signal line AGO of the odd-numbered memory row.

Under such voltage conditions of the rewriting process, for example, in the case where the memory cell MC22 is a normal memory cell which is not depleted (FIG. 29B) but the memory cells MC32, ..., and MCm2 are depleted memory cells (FIG. 29C) among the memory cells MC12 to MCm2 in an abnormal string, the depleted memory cells MC32, ..., and MCm2 are turned on and write current to the memory cell MC12 also flows into not only the memory cell MC12 but also the depleted memory cells MC32, ..., and MCm2. Therefore, the write current to the memory cell MC12 selected to be written is not sufficiently obtained and the rewriting process cannot be performed.

To simultaneously erase two or more arbitrary pages, it is necessary to take measures such as (1) simultaneous erasure of arbitrary one word line in a plurality of blocks and (2) scrambling to make page addresses continuous over blocks. By the measures, an erasure unit becomes large, so that the erasing rate can be improved. The erasure verification is executed concentratedly on arbitrary one page in a manner similar to the two-page erasing mode. By the measures, obviously, similar effects can be obtained also in the case of a bank unit made of a predetermined number of blocks.

For example, in FIGS. 30A and 30B, in assignment of two pages per word line, as shown in FIG. 30A, if page addresses continue in a block by assignment of page addresses x=0, 1, x=2, 3, ..., and x=510, 511 in block 0 and page addresses x=512, 513, x=514, 515, ..., and x=1022, 1023 in block 1, multi-page erasure cannot be performed. In other words, a plurality of pages in the same block cannot be erased simultaneously.

Consequently, as shown in FIG. 30B, the page addresses are made continuous over blocks by assigning the page addresses x=0, 1 and x=256, 257 in block 0, the page addresses x=2, 3 and x=258, 259 in block 1, ..., the page address x=252, 253 in block 126, and the page address x=254, 255 in block 127, thereby enabling multi-page erasure to be performed. The multi-page erasing mode will be described with reference to FIG. 31.

Figure 31:
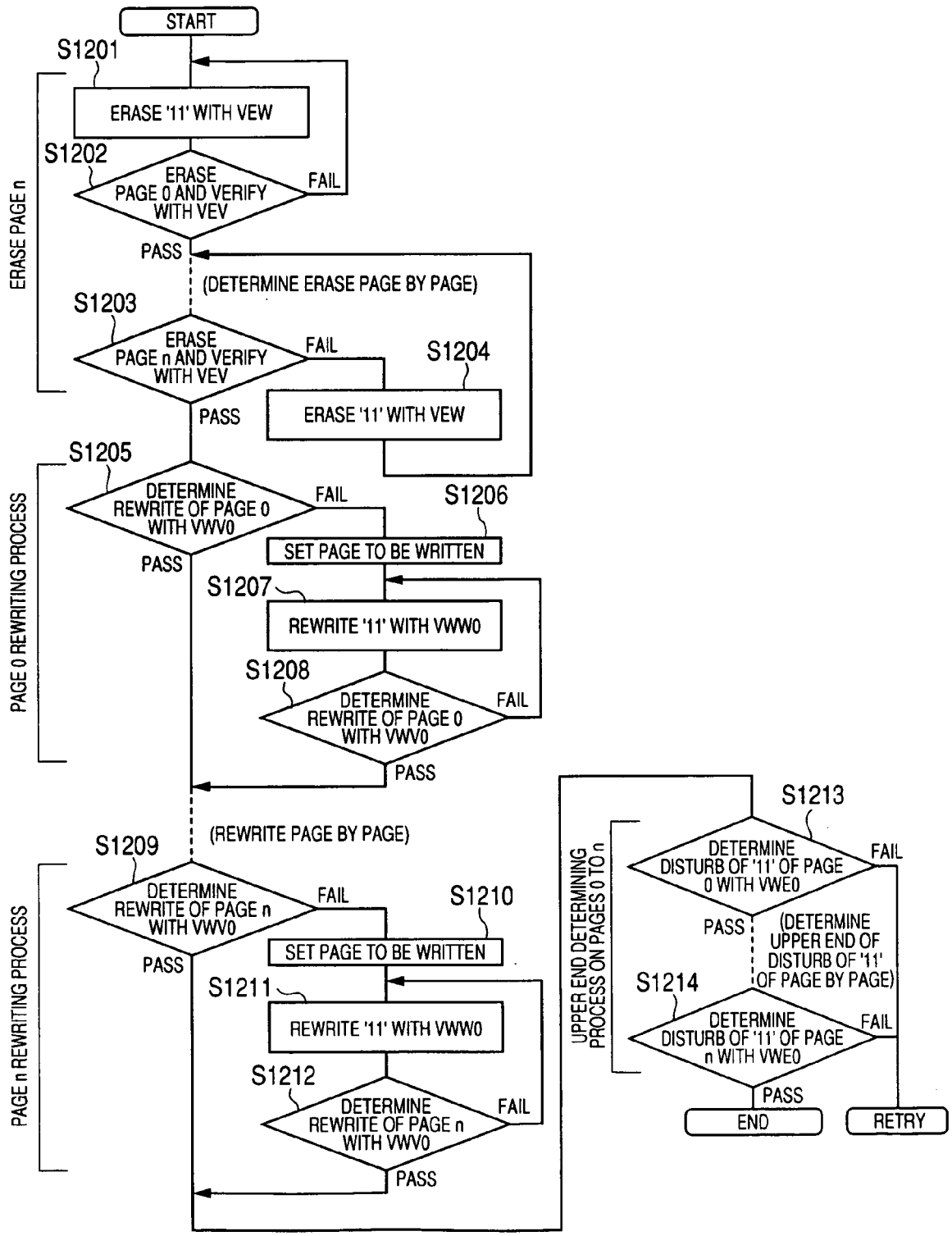
FIG. 31 is a flowchart showing a multi-page erasing mode.

As shown in FIG. 31, in the multi-page erasing mode, n-page erasure, 0-page rewriting process, n-page rewriting process, and upper end determining process on pages 0 to n are sequentially performed.

(1) In the n-page erasure, erase voltage (VEW) is applied to the page to be erased and, subsequently, erasure verification is performed (erase determination voltage VEV) (steps S1201 to S1204). In the erasure verification, erasing determination is made from the 0 page to the n page one page by one page. If a page passes the erasing determination, the routine moves to the next page. If a page fails the erasing determination, the processes from application of the erase voltage to the erasure verification are repeated until the page passes the erasing determination. In the case where predetermined time has elapsed before the page passes the determination, the routine is finished as abnormal end.

(2) In the 0-page rewriting process, rewrite determination is performed (with the rewrite determination voltage VWV0) on the page 0 (step S1205) If the page passes the rewrite determination, the routine advances to the next page. In the case of failure, the page to be rewritten is set, the rewrite voltage (VWW0) is applied to the page to be rewritten and, subsequently, rewriting determination (rewrite determination voltage VWV0) is performed (steps S1206 to S1208). If the page passes the rewriting determination, the routine advances to the next page. In the case of failure, the processes from application of a rewrite voltage to rewrite determination are repeated. In the case where predetermined time has elapsed before the page passes the determination, the routine is finished abnormally.

(3) In the n-page rewriting process, after completion of the 0-page rewriting process, in a manner similar to the 0-page rewriting process, rewriting process is performed page by page from page 1 to page n-1. For the page n, rewrite determination, setting of a page to be rewritten, application of a rewrite voltage to the page to be rewritten, and determination of rewriting are sequentially performed (steps S1209 to S1212).

(4) In the upper end determining process on pages 0 to n, disturb determination (with the upper end determination voltage VWE0) is executed on the page 0 (step S1213). If the page passes the disturb determination, the routine advances to the next page. In the case of failure, the disturb determination is re-tried. Subsequently, in a manner similar to the 0-page disturb determination, upper end determination is performed page by page from the page 1 to the page n-1, and disturb determination is made on the page n (step S1214).

Therefore, the flash memory of the embodiment can obtain the following effects.

(1) In the writing mode from the low voltage side of the writing operation, by reducing the number of times of data transfer from the SRAM to the sense latch circuit, the write time can be shortened and higher-speed writing operation can be realized. For example, the number of times of data transfer can be reduced to four as compared with six in the writing mode from the high voltage side.

(2) In the writing mode employing the simple upper end determination of the writing operation, by reducing the number of times of data transfer from the SRAM to the sense latch circuit, write time can be shortened and the higher-speed writing operation can be realized. For example, the number of times of data transfer can be reduced to the half (three times) of that (six times) of the writing mode from the high voltage side. Since additional writing can be realized also in the "one sense latch circuit+two SRAMs" configuration, at the time of writing on memory cells on a word line a plurality of times, the erasing process becomes unnecessary and, accordingly, the write time can be shortened.

(3) Since the write word voltage can be decreased by employing the channel hot electron injecting method, by employing the ISPP method for application of the write bias, the write bias can be optimized. For example, as compared with the power pulse method, the write bias application time can be suppressed to 1/10 or less (from 590 µs to 50 µs).

(4) As for the writing operation, reduction in the number of transfer times from the SRAM to the sense latch circuit and optimization of the write bias can be performed, so that the speed of the write operation can be increased.

(5) Improvement in the write transfer rate of the multi-value flash memory can be realized. Further, the write transfer rate of a flash memory card, a flash memory module, and the like using the flash memory is improved.

(6) In the two-page erasing mode of the erasing operation, by selectively performing erasure verification in the erasing operation on one of the pages, the speed of the erasing operation can be increased. Further, by performing the rewriting process in the erasing operation continuously page by page, overwriting caused by fluctuations in the threshold voltage of a memory cell can be prevented.

(7) In the multi-page erasing mode in the erasing operation, by simultaneously erasing an arbitrary word line in a plurality of blocks and scrambling the page addresses so as to be continuous in the blocks, the erasing rate can be improved.

(8) With respect to the erasing operation, the erasing sequence in the memory array configuration in which two pages are provided for one word line can be optimized. By increasing the erasure unit, the erasure rate is improved and the erasing operation can be performed at higher speed. Further, by optimizing the erasure determination, the number of erasure determining circuits can be reduced to the half.

(9) With respect to the "one sense latch circuit+two SRAMs" configuration, by realizing the sequence of reading, writing, and erasing the multivalue memory, the cell area per unit bit can be reduced.

(10) Increase in speed of the erasing operation of the flash memory and reduction in the chip area can be realized. Further, the speed of erasing of a flash memory card, a flash memory module, and the like using the flash memory can be increased and the cost can be reduced.

Although the invention achieved by the inventors herein has been concretely described on the basis of the embodiments, obviously, the invention is not limited to the foregoing embodiments but can be variously modified without departing from the gist.

For example, in the foregoing embodiment, the case where a data transfer circuit has the "one sense latch circuit+two SRAMs" configuration (FIG. 6) has been considered. From the viewpoint of reduction in the number of transfer times of write data, the write data buffer does not have to be an SRAM. For example, the invention can be also applied to the case of using a data latch circuit.

In the case of the writing mode (FIG. 20) employing the simple upper end determination in the writing operation of the embodiment, the "writing process" and the "upper end determining process" are continuously performed each time the threshold voltage is applied to a memory cell. Alternately, the upper end determining process may be performed at the end of the write flow. The erasing distribution disturb determination may be made at any timing as long as the writing of the "01" distribution of the highest voltage is finished.

In the erasing operation of the foregoing embodiment, in the case of the two-page erasing mode (FIG. 26), the number of pages to be simultaneously erased is not particularly regulated. That is, the invention can be also applied to the case of simultaneously erasing a plurality of pages having variations equivalent to variations in the erasing characteristics of arbitrary one page. The memory array configuration does not have to be a configuration in which the bit lines are thinned.

INDUSTRIAL APPLICABILITY

As described above, the semiconductor memory device of the invention is useful to, particularly, a multivalue flash memory on which a data buffer is mounted, a flash memory using the channel hot electron injecting method, and a flash memory in which a plurality of pages are connected to one word line with respect to the erasing operation. Further, the invention can be widely applied to a nonvolatile semiconductor memory device on which a data buffer is mounted, a semiconductor device using a flash memory, a semiconductor memory card, a semiconductor memory module, and the like.

The invention claimed is:

1. A nonvolatile memory comprising:
a nonvolatile memory array including a plurality of memory banks, each of which has a plurality of nonvolatile memory cells;
a plurality of buffer memories, each of which has a plurality of SRAM memory cells and corresponds to one of the memory banks; and
a control circuit,
wherein each of the plurality of SRAM memory cells is used for storing data to store to the corresponding memory bank,
wherein the control circuit is capable of controlling a program operation in response to a program command accompanied with address information and program data, and
wherein in the program operation, the control circuit selects one of the memory banks and one of the buffer memories corresponding to the address information, stores the program data to the selected buffer memory, and then stores the program data stored in the selected buffer memory to one of the nonvolatile memory cells in the selected memory bank.

2. A nonvolatile memory according to claim 1,
wherein each of the memory banks has a plurality of word lines, each of which is coupled to corresponding ones of the nonvolatile memory cells, and
wherein one buffer memory is capable of storing a volume of data corresponding to a volume of data storable in ones of the nonvolatile memory cells coupled to one word line.

3. A nonvolatile memory according to claim 2,
wherein each of the nonvolatile memory cells is capable of storing 2-bit data, and
wherein two SRAM memory cells are used for storing data for one nonvolatile memory cell.

4. A nonvolatile memory according to claim 3,
wherein each of the nonvolatile memory cells has a threshold voltage within an arbitrary one of a plurality of threshold voltage ranges,
wherein one of the threshold voltage ranges indicates an erase state, and
wherein the other threshold voltage ranges indicate program states.

5. A nonvolatile memory according to claim 4,
wherein the control circuit is capable of controlling an erase operation in response to an erase command accompanied with address information, and
wherein in the erase operation, the control circuit selects one word line corresponding to the address information, sets the threshold voltages of the nonvolatile memory cells coupled to the one word line to within the threshold voltage range indicating the erase state.

6. A nonvolatile memory according to claim 1, further comprising a plurality of IO terminals and IO buffers,
wherein the IO buffers are coupled between the IO terminals and the buffer memories, to temporarily store data being transmitted from the IO terminals to one of the buffer memories, and to temporarily store data being transmitted from one of the buffer memories to the IO terminals.

7. A nonvolatile memory according to claim 6, further comprising a bank select circuit,
wherein the bank select circuit selects one memory bank and one buffer memory in accordance with the address information.

* * * * *